United States Patent
Sen et al.

(10) Patent No.: US 12,021,621 B1
(45) Date of Patent: Jun. 25, 2024

(54) TECHNIQUES FOR MAPPING CODED BITS TO DIFFERENT CHANNEL RELIABILITY LEVELS FOR LOW DENSITY PARITY CHECK CODES

(71) Applicant: QUALCOMM Incorporated, San Diego, CA (US)

(72) Inventors: Pinar Sen, San Diego, CA (US); Wei Yang, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/155,437

(22) Filed: Jan. 17, 2023

(51) Int. Cl.
*H04L 1/18* (2023.01)
*H04L 1/00* (2006.01)

(52) U.S. Cl.
CPC .......... *H04L 1/0063* (2013.01); *H04L 1/0009* (2013.01); *H04L 1/0071* (2013.01)

(58) Field of Classification Search
None
See application file for complete search history.

(56) References Cited

U.S. PATENT DOCUMENTS

| | | | | |
|---|---|---|---|---|
| 7,584,401 B2 * | 9/2009 | Hong | ................ | H03M 13/6362 714/755 |
| 8,190,981 B2 * | 5/2012 | Jeong | ...................... | H04L 27/38 714/751 |
| 8,230,295 B2 * | 7/2012 | Jeong | ..................... | H03M 13/11 714/752 |
| 8,948,304 B2 * | 2/2015 | Jeong | .................. | H03M 13/356 375/295 |
| 11,233,531 B2 * | 1/2022 | Li | ......................... | H03M 13/118 |
| 2006/0218461 A1 * | 9/2006 | Kyung | ................ | H03M 13/255 714/758 |

(Continued)

FOREIGN PATENT DOCUMENTS

EP  2560310 A1  2/2013

OTHER PUBLICATIONS

Fang Y., et al., "Protograph Bit-Interleaved Coded Modulation: A Bandwidth-Efficient Design Paradigm for 6G Wireless Communications"arXiv:2112.08557v2 [cs.IT], Cornell University Library, 201 Olin Library Cornell University Ithaca, NY 14853, Oct. 27, 2022, pp. 1-40, XP091354709, Abstract, p. 9, p. 15.

(Continued)

*Primary Examiner* — Mujtaba M Chaudry
(74) *Attorney, Agent, or Firm* — Holland & Hart LLP

(57) ABSTRACT

Methods, systems, and devices for wireless communications are described. In some examples, a transmitting device may generate a parity check matrix based on performing a lifting operation on a base matrix. Each column of the base matrix may correspond to a different variable node and each row may correspond to a different check node. The transmitting device may then generate a set of coded bits based on the parity check matrix and each coded bit of the set of coded bits may be associated with a respective variable node. Further, the transmitting device may interleave the set of coded bits such that subsets of the set of coded bits associated with a same variable node are mapped to a same channel reliability level and transmit the set of coded bits according to the interleaving.

30 Claims, 17 Drawing Sheets

(56) References Cited

U.S. PATENT DOCUMENTS

| | | | | |
|---|---|---|---|---|
| 2007/0283216 | A1* | 12/2007 | Kyung | H03M 13/255 |
| | | | | 714/758 |
| 2009/0063929 | A1* | 3/2009 | Jeong | H04L 27/38 |
| | | | | 714/752 |
| 2009/0125781 | A1* | 5/2009 | Jeong | H04L 27/3488 |
| | | | | 714/752 |
| 2018/0131391 | A1* | 5/2018 | Kudekar | H03M 13/3723 |
| 2020/0358557 | A1* | 11/2020 | Park | H04B 7/024 |

OTHER PUBLICATIONS

International Search Report and Written Opinion—PCT/US2024/01002—ISA/EPO—Apr. 9, 2024.
Steiner F., et al., "Protograph—Based LDPC Code Design for Shape Bit-Metric Decoding", IEEE Journal on Selected Areas in Communication, IEEE Service Center, Piscataway, US, vol. 34, No. 2, Feb. 1, 2016, pp. 397-407, XP011593856.

\* cited by examiner

TECHNIQUES FOR MAPPING CODED BITS TO DIFFERENT CHANNEL RELIABILITY LEVELS FOR LOW DENSITY PARITY CHECK CODES

TECHNICAL FIELD

The following relates generally to wireless communications, and more specifically to techniques for mapping coded bits to different channel reliability levels for low density parity check (LDPC) codes.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more network entities, each supporting wireless communication for communication devices, which may be known as user equipment (UE).

In some examples, wireless devices of a wireless communications system may support error correcting codes (ECC). ECCs may allow the wireless devices to identify and potentially correct errors present in received data. An example of ECCs may be low density parity check (LDPC) codes. LDPC codes are linear ECCs that are constructed using sparse graphs (e.g., a spare Tanner graph).

SUMMARY

The described techniques relate to improved methods, systems, devices, and apparatuses that support techniques for mapping coded bits to different channel reliability levels for low density parity check (LDPC) codes. For example, the described techniques provide for a mapping scheme that allows for a wireless device to map coded bits generated from LDPC codes to a same channel reliability level. In some examples, a transmitting device (or a transmitter device) may generate a parity check matrix. The parity check matrix may be generated using a base matrix whose columns represent different variable nodes and whose rows represent different check nodes. Further, the transmitting device may generate a set of coded bits using the parity check matrix. The set of coded bits may include data bits and parity check bits and each coded bit of the set of coded bits may correspond to a respective variable node of the base matrix.

Upon generating the set of coded bits, the transmitting device may interleave (e.g., using a block-interleaver) the set of coded bits such that subsets of the set of coded bits associated with a same variable node are grouped together. The interleaving may allow the transmitting device to map the subsets of the coded bits corresponding to a same variable node to be mapped to a same channel reliability level (e.g., a same spatial layer or modulation level). The transmitting device may transmit the set of coded bits to a receiving device (e.g., receiver device) according to the interleaving and the receiving device may utilize similar techniques to decode the received set of coded bits. These techniques may allow a transmitting device to map coded bits corresponding to a same variable node to a same channel reliability level which may result in faster decoding at the receiving device when compared to other methods.

A method for wireless communication at a wireless device is described. The method may include generating a parity check matrix based on performing a lifting operation on a base matrix, where each column of the base matrix corresponds to a different variable node and each row corresponds to a different check node, generating a set of coded bits based on the parity check matrix, where the set of coded bits includes a set of data bits and a set of parity bits and each coded bit of the set of coded bits is associated with a respective variable node, interleaving the set of coded bits such that subsets of the set of coded bits associated with a same variable node are mapped to a same channel reliability level, and transmitting the set of coded bits according to the interleaving.

An apparatus for wireless communication at a wireless device is described. The apparatus may include at least one processor and memory coupled (e.g., operatively, communicatively, functionally, electronically, or electrically) with the at least one processor. The memory may store instructions for the at least one processor to cause the wireless device to generate a parity check matrix based on performing a lifting operation on a base matrix, where each column of the base matrix corresponds to a different variable node and each row corresponds to a different check node, generate a set of coded bits based on the parity check matrix, where the set of coded bits includes a set of data bits and a set of parity bits and each coded bit of the set of coded bits is associated with a respective variable node, interleave the set of coded bits such that subsets of the set of coded bits associated with a same variable node are mapped to a same channel reliability level, and transmit the set of coded bits according to the interleaving.

Another apparatus for wireless communication at a wireless device is described. The apparatus may include means for generating a parity check matrix based on performing a lifting operation on a base matrix, where each column of the base matrix corresponds to a different variable node and each row corresponds to a different check node, means for generating a set of coded bits based on the parity check matrix, where the set of coded bits includes a set of data bits and a set of parity bits and each coded bit of the set of coded bits is associated with a respective variable node, means for interleaving the set of coded bits such that subsets of the set of coded bits associated with a same variable node are mapped to a same channel reliability level, and means for transmitting the set of coded bits according to the interleaving.

A non-transitory computer-readable medium storing code for wireless communication at a wireless device is described. The code may include instructions executable by at least one processor to generate a parity check matrix based on performing a lifting operation on a base matrix, where each column of the base matrix corresponds to a different variable node and each row corresponds to a different check node, generate a set of coded bits based on the parity check matrix, where the set of coded bits includes a set of data bits and a set of parity bits and each coded bit of the set of coded bits is associated with a respective variable node, interleave the set of coded bits such that subsets of the set of coded bits associated with a same variable node are mapped to a same channel reliability level, and transmit the set of coded bits according to the interleaving.

Some examples of the method, apparatuses, and non-transitory computer-readable medium described herein may further include operations, features, means, or instructions for mapping a first subset of the set of coded bits associated with a first variable node to a first spatial layer based on interleaving the set of coded bits.

Some examples of the method, apparatuses, and non-transitory computer-readable medium described herein may further include operations, features, means, or instructions for mapping a second subset of the set of coded bits associated with a second variable node to a second spatial layer based on interleaving the set of coded bits.

In some examples of the method, apparatuses, and non-transitory computer-readable medium described herein, mapping at least a portion of a second subset of the set of coded bits associated with a second variable node to the first spatial layer based on interleaving the set of coded bits, where the second variable node may be adjacent to the first variable node in the base matrix.

Some examples of the method, apparatuses, and non-transitory computer-readable medium described herein may further include operations, features, means, or instructions for modulating a first subset of the set of coded bits associated with a first variable node such that the first subset of the set of coded bits corresponds to a first modulation level based on interleaving the set of coded bits.

Some examples of the method, apparatuses, and non-transitory computer-readable medium described herein may further include operations, features, means, or instructions for mapping the first subset of the set of coded bits to a first spatial layer based on interleaving the set of coded bits.

Some examples of the method, apparatuses, and non-transitory computer-readable medium described herein may further include operations, features, means, or instructions for transmitting a first subset of the set of coded bits associated with a first variable node using a same frequency hop, a same precoding resource block group (PRG), or a same physical resource block (PRB).

Some examples of the method, apparatuses, and non-transitory computer-readable medium described herein may further include operations, features, means, or instructions for generating a set of shaped bits and a set of unshaped bits based on performing a probabilistic shaping operation, where the set of data bits includes the set of unshaped bits and the set of shaped bits and interleaving, prior to generate the set of coded bits, the set of data bits such that subsets of the set of shaped bits associated with a same variable node may be mapped to a same channel reliability level.

In some examples of the method, apparatuses, and non-transitory computer-readable medium described herein, mapping each unshaped bit of the set of unshaped bits to a most significant bit (MSB) of a respective symbol.

In some examples of the method, apparatuses, and non-transitory computer-readable medium described herein, an interleaver used to perform the interleaving of the set of coded bits includes a block-interleaver.

In some examples of the method, apparatuses, and non-transitory computer-readable medium described herein, the block-interleaver may have a depth that may be equal to a modulation order multiplied with a threshold quantity of spatial layers and a length that may be equal to a threshold number of subcarriers.

A method for wireless communication at a receiving device is described. The method may include generating a parity check matrix based on performing a lifting operation on a base matrix, where each column of the base matrix corresponds to a different variable node and each row corresponds to a different check node, receiving a set of coded bits, where the set of coded bits includes a set of data bits and a set of parity bits and each coded bit of the set of coded bits is associated with a respective variable node, interleaving the set of coded bits such that subsets of the set of coded bits corresponding to a same variable node are mapped to same channel reliability level, and decoding the set of data bits based on the set of parity bits and the parity check matrix.

An apparatus for wireless communication at a receiving device is described. The apparatus may include at least one processor and memory coupled (e.g., operatively, communicatively, functionally, electronically, or electrically) with the at least one processor. The memory may store instructions for the at least one processor to cause the receiving the device to generate a parity check matrix based on performing a lifting operation on a base matrix, where each column of the base matrix corresponds to a different variable node and each row corresponds to a different check node, receive a set of coded bits, where the set of coded bits includes a set of data bits and a set of parity bits and each coded bit of the set of coded bits is associated with a respective variable node, interleave the set of coded bits such that subsets of the set of coded bits corresponding to a same variable node are mapped to same channel reliability level, and decode the set of data bits based on the set of parity bits and the parity check matrix.

Another apparatus for wireless communication at a receiving device is described. The apparatus may include means for generating a parity check matrix based on performing a lifting operation on a base matrix, where each column of the base matrix corresponds to a different variable node and each row corresponds to a different check node, means for receiving a set of coded bits, where the set of coded bits includes a set of data bits and a set of parity bits and each coded bit of the set of coded bits is associated with a respective variable node, means for interleaving the set of coded bits such that subsets of the set of coded bits corresponding to a same variable node are mapped to same channel reliability level, and means for decoding the set of data bits based on the set of parity bits and the parity check matrix.

A non-transitory computer-readable medium storing code for wireless communication at a receiving device is described. The code may include instructions executable by at least one processor to generate a parity check matrix based on performing a lifting operation on a base matrix, where each column of the base matrix corresponds to a different variable node and each row corresponds to a different check node, receive a set of coded bits, where the set of coded bits includes a set of data bits and a set of parity bits and each coded bit of the set of coded bits is associated with a respective variable node, interleave the set of coded bits such that subsets of the set of coded bits corresponding to a same variable node are mapped to same channel reliability level, and decode the set of data bits based on the set of parity bits and the parity check matrix.

In some examples of the method, apparatuses, and non-transitory computer-readable medium described herein, receiving the set of coded bits may include operations, features, means, or instructions for receiving a first subset of the set of coded bits associated with a first variable node via a first spatial layer.

In some examples of the method, apparatuses, and non-transitory computer-readable medium described herein, receiving the set of coded bits may include operations, features, means, or instructions for receiving a second subset of the set of coded bits associated with a second variable node via a second spatial layer.

In some examples of the method, apparatuses, and non-transitory computer-readable medium described herein, receiving the set of coded bits may include operations, features, means, or instructions for receiving at least a portion of a second subset of the set of coded bits associated with a second variable node via the first spatial layer, where the second variable node may be adjacent to the first variable node in the base matrix.

Some examples of the method, apparatuses, and non-transitory computer-readable medium described herein may further include operations, features, means, or instructions for demodulating a set of symbols, where a first modulation level corresponds to a first subset of the set of coded bits that may be associated with a first variable node.

In some examples of the method, apparatuses, and non-transitory computer-readable medium described herein, receiving the set of coded bits may include operations, features, means, or instructions for receiving the first subset of the set of coded bits via a first spatial layer.

In some examples of the method, apparatuses, and non-transitory computer-readable medium described herein, receiving the set of coded bits may include operations, features, means, or instructions for receiving a first subset of the set of coded bits associated with a first variable node using a same frequency hop, a same PRG, or a same PRB.

Some examples of the method, apparatuses, and non-transitory computer-readable medium described herein may further include operations, features, means, or instructions for interleaving, after determining the set of data bits, a set of shaped bits such that a first subset of the set of shaped bits corresponding to an imaginary part of an amplitude may be grouped together and a second subset of the set of shaped bits corresponding to a real part of the amplitude may be grouped together, where the set of data bits includes the set of shaped bits and a set of unshaped bits and performing a probabilistic shaping operation on the set of data bits.

In some examples of the method, apparatuses, and non-transitory computer-readable medium described herein, an interleaver used to perform the interleaving of the set of coded bits includes a block-interleaver.

In some examples of the method, apparatuses, and non-transitory computer-readable medium described herein, the block-interleaver may have a depth that may be equal to a modulation order multiplied by a threshold quantity of spatial layers and a length that may be equal to a threshold number of subcarriers.

DETAILED DESCRIPTION

In some examples, a wireless device (e.g., a UE or a network entity) may utilize error correcting codes (ECC) to correct errors in data that may occur when transmitting the data to another wireless device. One type of ECC may be a low density parity check (LDPC) code. LDPC codes are characterized by a base matrix and a lifting operation. The base matrix may include multiple columns and multiple rows. Each column may represent a variable node and each row may represent a check node. Further, each variable node may correspond to a coded bit (e.g., a data bit or a parity bit). The lifting operation creates a parity check matrix by lifting each entry of the base matrix by a circulant identity matrix. When transmitting a set of coded bits (e.g., data bits and corresponding parity bits) to a receiving device, a transmitting device may distribute coded bits corresponding to a same variable node across different channel reliability levels. For example, a transmitting device may map coded bits corresponding to a same variable node to different spatial layers. However, mapping coded bits corresponding to a same variable node to different channel reliability level may increase processing latency related to decoding, decrease reliability of the decoding, and decrease channel throughput.

As described herein, the transmitting device may utilize a different technique for mapping coded bits to channel reliability levels. In some examples, the transmitting device may generate the parity check matrix. Further, the transmitting device may generate a set of coded bits that includes a set of data bits and a set of parity bits using the parity check matrix. The device may then perform an interleaving procedure on the set of the coded bits. As one example, the interleaving procedure may allow for coded bits corresponding to a same variable node to be mapped to a same channel reliability level (e.g., a same spatial layer or a same modulation level). The wireless device receiving the set of coded bits may utilize a similar interleaving procedure and the parity check matrix to decode the data bits. Using such techniques may allow a decoder of the receiving device to converge faster on variable nodes that correspond to a higher reliability level which may decrease the overall average decoding time for the data bits, increase the accuracy of the decoding, and increase channel throughput.

Aspects of the disclosure are initially described in the context of wireless communications systems. Further aspects of the disclosure are described in the context of an interleaving scheme, a probabilistic shaping scheme, a resource mapping scheme, and a process flow. Aspects of the disclosure are further illustrated by and described with reference to apparatus diagrams, system diagrams, and flowcharts that relate to techniques for mapping coded bits to different channel reliability levels for LDPC codes.

Figure 1:
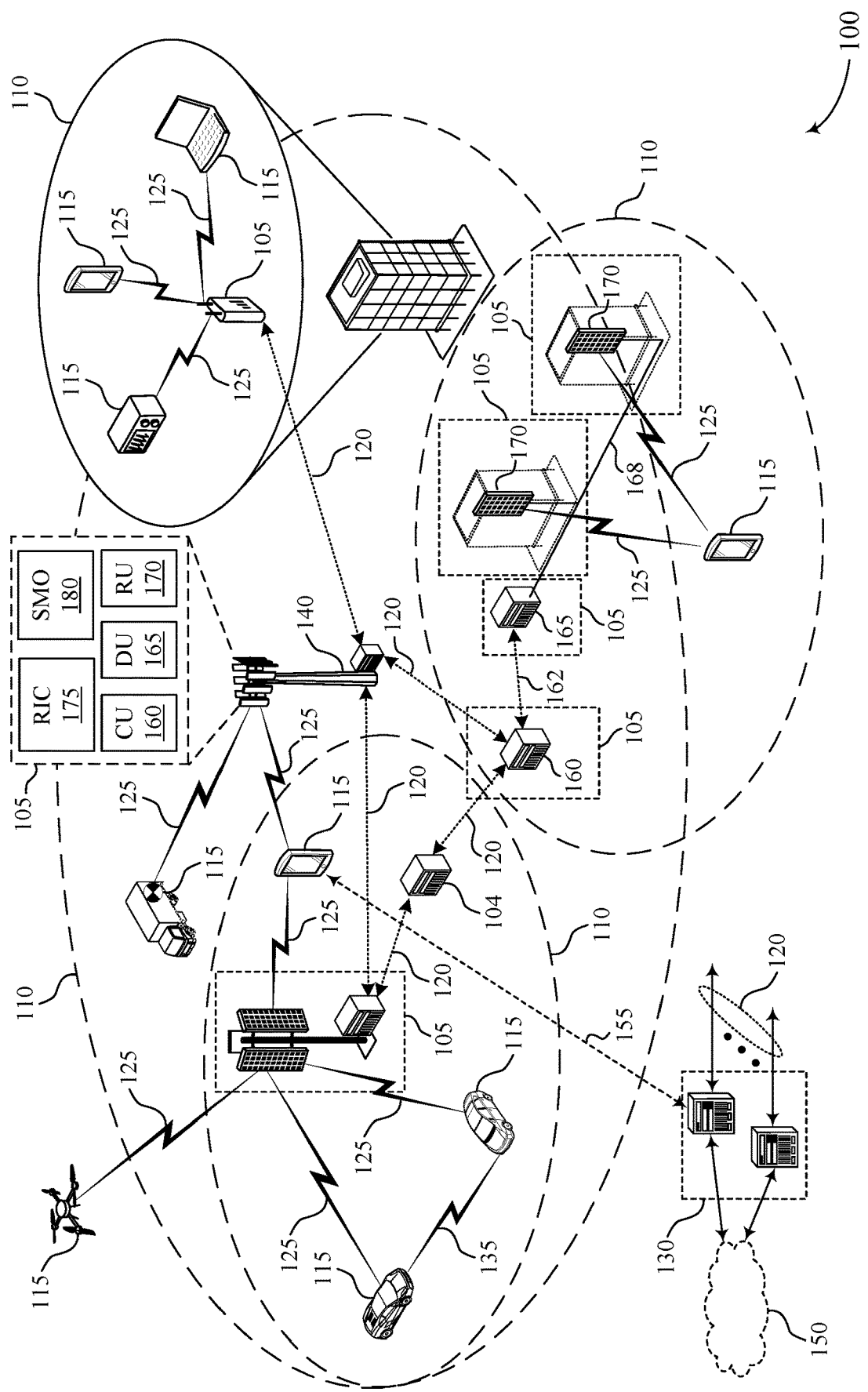
FIGS. 1 and 2 illustrate examples of a wireless communications system that supports techniques for mapping coded bits to different channel reliability levels for low density parity check (LDPC) codes in accordance with one or more aspects of the present disclosure.

FIG. 1 illustrates an example of a wireless communications system 100 that supports techniques for mapping coded bits to different channel reliability levels for LDPC codes in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be capable of supporting communications with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, or computing system may include disclosure of the UE 115, network entity 105, apparatus, device, or computing system. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another via a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 via a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending on which functions (e.g., network layer functions, protocol layer functions, baseband functions, RF functions, and any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c, F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication via such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

In the case of the techniques described herein applied in the context of a disaggregated RAN architecture, one or more components of the disaggregated RAN architecture may be configured to support techniques for mapping coded bits to different channel reliability levels for LDPC codes as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a multimedia/entertainment device (e.g., a radio, a MP3 player, or a video device), a camera, a gaming device, a navigation/positioning device (e.g., GNSS (global navigation satellite system) devices based on, for example, GPS (global positioning system), Beidou, GLONASS, or Galileo, or a terrestrial-based device), a tablet computer, a laptop computer, a netbook, a smartbook, a personal computer, a smart device, a wearable device (e.g., a smart watch, smart clothing, smart glasses, virtual reality goggles, a smart wristband, smart jewelry (e.g., a smart ring, a smart bracelet)), a drone, a robot/robotic device, a vehicle, a vehicular device, a meter (e.g., parking meter, electric meter, gas meter, water meter), a monitor, a gas pump, an appliance (e.g., kitchen appliance, washing machine, dryer), a location tag, a medical/healthcare device, an implant, a sensor/actuator, a display, or any other suitable device configured to communicate via a wireless or wired medium. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) using resources associated with one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

In some examples, such as in a carrier aggregation configuration, a carrier may also have acquisition signaling or control signaling that coordinates operations for other carriers. A carrier may be associated with a frequency channel (e.g., an evolved universal mobile telecommunication system terrestrial radio access (E-UTRA) absolute RF channel number (EARFCN)) and may be identified according to a channel raster for discovery by the UEs 115. A carrier may be operated in a standalone mode, in which case initial acquisition and connection may be conducted by the UEs 115 via the carrier, or the carrier may be operated in a non-standalone mode, in which case a connection is anchored using a different carrier (e.g., of the same or a different radio access technology).

The communication links 125 shown in the wireless communications system 100 may include downlink transmissions (e.g., forward link transmissions) from a network entity 105 to a UE 115, uplink transmissions (e.g., return link transmissions) from a UE 115 to a network entity 105, or both, among other configurations of transmissions. Carriers may carry downlink or uplink communications (e.g., in an FDD mode) or may be configured to carry downlink and uplink communications (e.g., in a TDD mode).

A carrier may be associated with a particular bandwidth of the RF spectrum and, in some examples, the carrier bandwidth may be referred to as a "system bandwidth" of the carrier or the wireless communications system 100. For example, the carrier bandwidth may be one of a set of bandwidths for carriers of a particular radio access technology (e.g., 1.4, 3, 5, 10, 15, 20, 40, or 80 megahertz (MHz)). Devices of the wireless communications system 100 (e.g., the network entities 105, the UEs 115, or both) may have hardware configurations that support communications using a particular carrier bandwidth or may be configurable to support communications using one of a set of carrier bandwidths. In some examples, the wireless communications system 100 may include network entities 105 or UEs 115 that support concurrent communications using carriers associated with multiple carrier bandwidths. In some examples, each served UE 115 may be configured for operating using portions (e.g., a sub-band, a BWP) or all of a carrier bandwidth.

Signal waveforms transmitted via a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both), such that a relatively higher quantity of resource elements (e.g., in a transmission duration) and a relatively higher order of a modulation scheme may correspond to a relatively higher rate of communication. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

The time intervals for the network entities 105 or the UEs 115 may be expressed in multiples of a basic time unit which may, for example, refer to a sampling period of $T_s=1/(\Delta f_{max} \cdot N_f)$ seconds, for which $\Delta f_{max}$ may represent a supported subcarrier spacing, and $N_f$ may represent a supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively-numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots associated with one or more symbols. Excluding the cyclic prefix, each symbol period may be associated with one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (sTTIs)).

Physical channels may be multiplexed for communication using a carrier according to various techniques. A physical control channel and a physical data channel may be multiplexed for signaling via a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a network entity 105 (e.g., a base station 140) without human intervention. In some examples, M2M communication or MTC may include communications from devices that integrate sensors or meters to measure or capture information and relay such information to a central server or application program that uses the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging. In an aspect, techniques disclosed herein may be applicable to MTC or IoT UEs. MTC or IoT UEs may include MTC/enhanced MTC (eMTC, also referred to as CAT-M, Cat M1) UEs, NB-IoT (also referred to as CAT NB1) UEs, as well as other types of UEs. eMTC and NB-IoT may refer to future technologies that may evolve from or may be based on these technologies. For example, eMTC may include FeMTC (further eMTC), eFeMTC (enhanced further eMTC), and mMTC (massive MTC), and NB-IoT may include eNB-IoT (enhanced NB-IoT), and FeNB-IoT (further enhanced NB-IoT).

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be configured to support communicating directly with other UEs 115 via a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by (e.g., scheduled by) the network entity 105. In some examples, one or more UEs 115 of such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without an involvement of a network entity 105.

In some systems, a D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., network entities 105, base stations 140, RUs 170) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. UHF waves may be blocked or redirected by buildings and environmental features, which may be referred to as clusters, but the waves may penetrate structures sufficiently for a macro cell to provide service to the UEs 115 located indoors. Communications using UHF waves may be associated with smaller antennas and shorter ranges (e.g., less than 100 kilometers) compared to communications using the smaller frequencies and longer waves of the high frequency (HF) or very high frequency (VHF) portion of the spectrum below 300 MHz.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology using an unlicensed band such as the 5 GHz industrial, scientific, and medical (ISM) band. While operating using unlicensed RF spectrum bands, devices such as the network entities 105 and the UEs 115 may employ carrier sensing for collision detection and avoidance. In some examples, operations using unlicensed bands may be based on a carrier aggregation configuration in conjunction with component carriers operating using a licensed band (e.g., LAA). Operations using unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more network entity antennas or antenna arrays may be co-located at an antenna assembly, such as an antenna tower. In some examples, antennas or antenna arrays associated with a network entity 105 may be located at diverse geographic locations. A network entity 105 may include an antenna array with a set of rows and columns of antenna ports that the network entity 105 may use to support beamforming of communications with a UE 115. Likewise, a UE 115 may include one or more antenna arrays that may support various MIMO or beamforming operations. Additionally, or alternatively, an antenna panel may support RF beamforming for a signal transmitted via an antenna port.

The network entities 105 or the UEs 115 may use MIMO communications to exploit multipath signal propagation and increase spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry information associated with the same data stream (e.g., the same codeword) or different data streams (e.g., different codewords). Different spatial layers may be associated with different antenna ports used for channel measurement and reporting. MIMO techniques include single-user MIMO (SU-MIMO), for which multiple spatial layers are transmitted to the same receiving device, and multiple-user MIMO (MU-MIMO), for which multiple spatial layers are transmitted to multiple devices.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating along particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

As described herein, a transmitting device (e.g., the UE 115 or the network entity 105) may map coded bits generated from LDPC codes to a same channel reliability level. In some examples, a transmitting device may generate a parity check matrix. The parity check matrix may be generated using a base matrix whose columns represent different variable nodes and whose rows represent different check nodes. Further, the transmitting device may generate a set of coded bits using the parity check matrix. The set of coded bits may include data bits and parity check bits and each coded bit of the set of coded bits may correspond to a respective variable node of the base matrix. Upon generating the set of coded bits, the transmitting device may interleave (e.g., using a block-interleaver) the set of coded bits such that subsets of the set of coded bits associated with a same variable node are grouped together. The interleaving may allow the transmitting device to map the subsets of the coded bits corresponding to a same variable node to be mapped to a same channel reliability level (e.g., a same spatial layer or modulation level). The transmitting device may transmit the set of coded bits to a receiving device (e.g., the UE 115 or the network entity 105) according to the interleaving and the receiving device may utilize similar or complementary techniques to decode the received set of coded bits. The methods as described herein may allow a transmitting device to map coded bits corresponding to a same variable node to a same channel reliability level which may result in faster decoding and greater accuracy at the receiving device when compared to other methods. This faster decoding and greater accuracy may provide for greater channel throughput, better reliability and lower latency in communications, and improved power efficiency, among other benefits.

Figure 2:
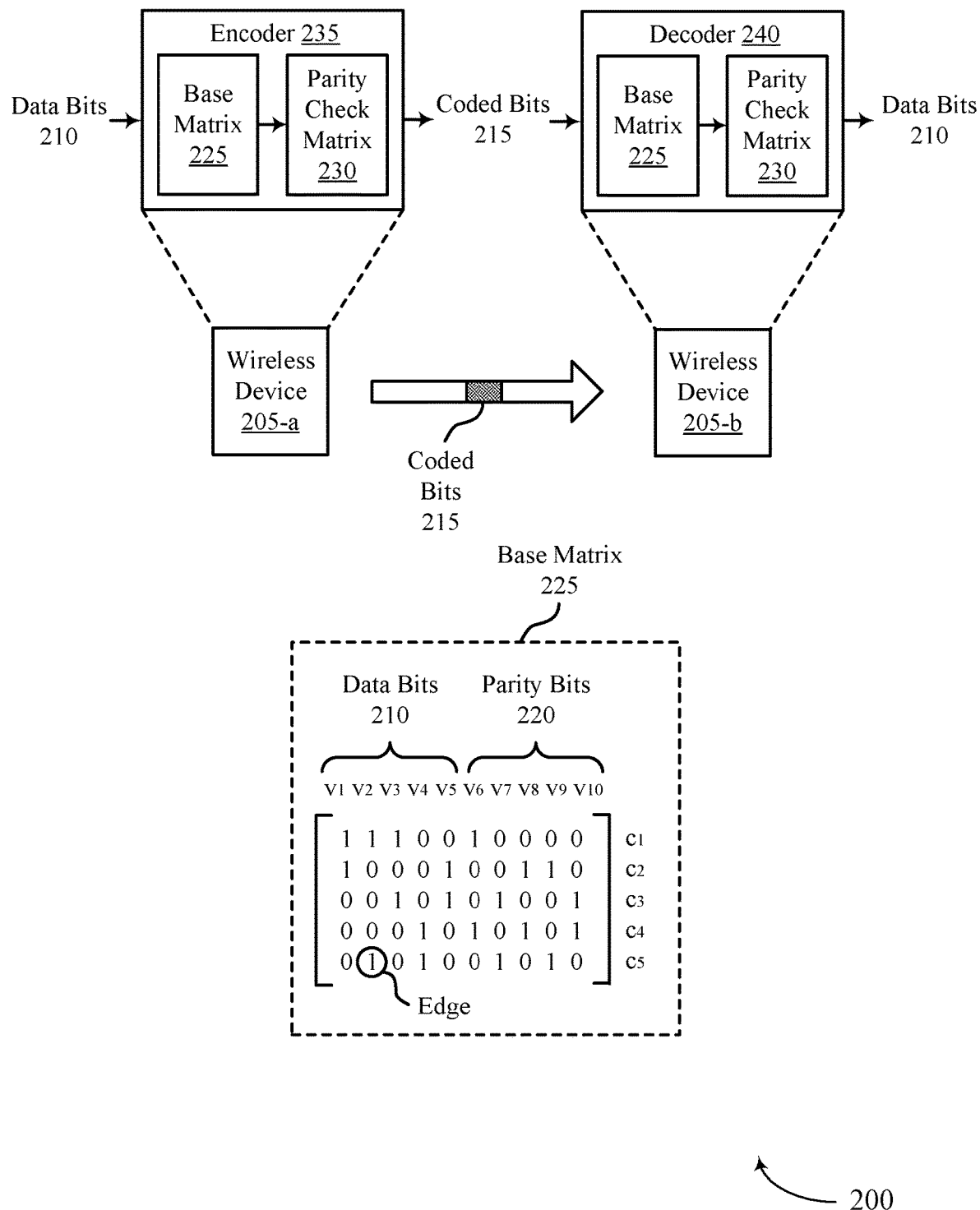

FIG. 2 illustrates an example of a wireless communications system 200 that supports techniques for mapping coded bits to different channel reliability levels for LDPC codes in accordance with one or more aspects of the present disclosure. In some examples, the wireless communications system 200 may implement aspects of a wireless communications system 100. For examples, the wireless communications system 200 may include wireless devices 205 (e.g., a wireless device 205-a and a wireless device 205-b) which may be examples of a UE 115 or a network entity 105 as described with reference to FIG. 1.

In some examples, the wireless device 205-a may be an example of a transmitting device and the wireless device 205-b may be an example of a receiving device. In such example, the wireless device 205-a may include an encoder 235 that may enable the wireless device 205-a to transform data bits 210 into coded bits 215 using one or more encoding operations. The coded bits 215 are then transmitted over a communication medium (e.g., a channel) to the wireless device 205-b. The wireless device 205-b may include a decoder 240 that may allow the wireless device 205-b to revert the coded bits 215 back into the data bits 210 using one or more decoding operations.

In some examples, the one or more encoding operations may include an error correction operation. The error correction operation may use an ECC to protect the data bits 210 from errors that may result from transmitting the data bits 210 over the channel. One example of an ECC is an LDPC code. LDPC codes are described by a base matrix 225 and a lifting operation. As shown in FIG. 2, the base matrix 225 may include multiple columns and multiple rows. Each column in the base matrix 225 may correspond to a different variable node and each row in the base matrix may correspond to a different check node. As an example, the base matrix 225 may include variable nodes $v_1, v_2, v_3, v_4, v_5, v_6, v_7, v_8, v_9$ and $v_{10}$ and check nodes $c_1, c_2, c_3, c_4$, and $c_5$. As such, the base matrix 225 may be an example of a (10, 5) linear block code.

In some examples, each variable node may correspond to one or more bits included in a codeword. A codeword may include data bits 210 as well as parity bits 220 and as such, each variable node may correspond to one or more data bits 210 or one or more parity bits 220. In the example of FIG. 2, the variable nodes $v_1, v_2, v_3, v_4$, and $v_5$ may correspond to the data bits 210 and the variable nodes $v_6, v_7, v_8, v_9$ and $v_{10}$ may correspond to the parity bits 220. Further, the base matrix 225 may include bit values of 1 and 0. A bit value of 1 may indicate an edge or in other words, a bit value of 1 may indicate that a corresponding variable node is connected to a corresponding check node. For example, in FIG. 2, the variable nodes $v_1, v_2, v_3$, and $v_6$ are connected to check node $c_1$. A sum (e.g., exclusive or (XOR)) of the bits connected to a check node may be equal to zero.

For LDPC codes, the base matrix 225 may be transformed into a parity check matrix 230. To transform the base matrix 225 into a parity check matrix 230, each of the entries in the base matrix 225 may be lifted by a circulant identify matrix. That is, the base matrix 225 may be copied some quantity of times (e.g., Z times) and different copies of the base matrix 225 may be connected together via edge permutation. As such, the lifting operation may result in parity check matrix 230 with dimensions Z×Z and each variable node may be associated with Z bits of the parity check matrix 230. As an order of operation, at the wireless device 205-a, the data bits 210 may be input into the encoder 235. The encoder 235 may utilize the data bits 210 and the parity check matrix 230 to generate the coded bits 215. In some examples, the coded bits 215 may include the data bits 210 as well as the parity bits 220.

Further, the coded bits 215 may undergo one or more other operations prior to being transmitted to the wireless device 205-b. For example, the coded bits 215 may be mapped to a constellation in a constellation diagram. A constellation diagram may illustrate how information in a digital modulation scheme (e.g., quadrature amplitude modulation (QAM)) is represented in a modulated carrier. Each point in the constellation diagram may be known as a symbol and each symbol may include one or more bits. Further, for QAM constellations, each symbol may correspond to a unique combination of phase and amplitude. In some examples, different bits of a symbol may be associated with different reliabilities. For example, a first bit in the symbol may be known as a most significant bit (MSB) and may be associated with a higher reliability and a second bit in the symbol may be known as a least significant bit (LSB) and may be associated with a lower reliability than the MSB.

In addition to constellation mapping, the coded bits 215 may also be mapped to different spatial layers in MIMO systems. Operating within a MIMO system may allow a transmitting device (e.g., the wireless device 205-a) to transmit more than one data stream using the same time and frequency resources. As one example, the transmitting device may transmit a first data stream using one or more of a first polarization, a first beam, or a first transmit antenna (e.g., a first spatial layer), and may transmit a second data stream using one or more of a second polarization, a second beam, or a second transmit antenna (e.g., a second spatial layer), simultaneously. The data streams (e.g., the first data stream and the second data stream) may include the same information or different information. Similar to constellations, different spatial layers may be associated with different reliabilities. The different reliabilities may be a result of the different channel conditions seen at each spatial layer (e.g., different signal-to-noise ratios (SNRs)).

Using other methods, the coded bits 215 may be mapped to constellations and spatial layers such that when the coded bits 215 are read or received at the receiving device, the coded bits 215 are in an order suitable for error correction (e.g., using LDPC codes). As an example, the coded bits 215 may include at least $a_0, a_1, a_2, a_3, a_4$, and $a_5$, where $a_0, a_1$, and $a_2$ are associated with a first variable node and $a_3, a_4$, and $a_5$ are associated with a second variable node. Using other techniques, the transmitting device (e.g., the wireless device 205-a) may map $a_0$ to a first bit (e.g., an MSB) of a constellation and a first spatial layer, $a_1$ to a second bit (e.g., an LSB) of the constellation and the first spatial layer, and $a_2$ to a third bit of the constellation and the first spatial layer. Further, the transmitting device may map $a_3$ to a first bit (e.g., an MSB) of a constellation and a second spatial layer, $a_4$ to a second bit (e.g., an LSB) of the constellation and the second spatial layer, and $a_5$ to a third bit of the constellation and the second spatial layer. However, using such mapping may result in inefficient decoding at the receiver side. When the decoder 240 performs iterative decoding on the coded bits 215 that are mapped in such a way, the decoder 240 may converge at a slow rate because there is asymmetry in channel reliabilities of the variable nodes. For example, when $a_0$ is mapped to the first bit of the constellation and $a_1$ is mapped to a second bit of the constellation, $a_0$ may be associated with a higher reliability than $a_1$.

As described herein, the coded bits 215 corresponding to a same variable node may be mapped to a same reliability level. In some examples, the encoder 235 may include a block-interleaver. A depth of the block-interleaver may depend on a quantity of spatial layers and a modulation order and a length of the block-interleaver may depend on a quantity of subcarriers (e.g., resource elements (REs)). For example, the depth may be equal to the quantity of spatial layers multiplied by the modulation order and the length may be equal to the quantity of subcarriers. Prior to performing the error correction operation (e.g., applying LDPC codes), the transmitting device (e.g., the wireless device 205-a) may input the coded bits 215 into the block-interleaver row by row and the block-interleaver may output the coded bits 215 column by column.

As an example, an initial order of the coded bits 215 may be $a_0, a_1, a_2, a_3, a_4,$ and $a_5$, where $a_0, a_1,$ and $a_2$ are associated with a first variable node, $a_3, a_4,$ and $a_5$ are associated with a second variable node. Further, the quantity of spatial layers may be equal to one, the modulation order may be equal to four (e.g., 2 bits per symbol), and the quantity of REs may be equal to three resulting in a block-interleaver with a depth of two and a length of three. After being input into the block-interleaver, the resulting order of the coded bits 215 may be $a_0, a_3, a_1, a_4, a_2,$ and $a_5$. As such, the transmitting device (e.g., the wireless device 205-a) may map $a_0$ to a first bit (e.g., an MSB) of a constellation and a spatial layer, $a_3$ to a second bit (e.g., an LSB) of the constellation and the spatial layer, $a_1$ to a first bit (e.g., an MSB) of a constellation and the spatial layer, $a_4$ to a second bit (e.g., an LSB) of the constellation and the spatial layer, $a_2$ to a first bit (e.g., an MSB) of a constellation and the spatial layer, and $a_5$ to a second bit (e.g., an LSB) of the constellation and the spatial layer. This mapping may result in a first symbol that may include $a_0$ and $a_3$, a second symbol that may include $a_1$ and $a_4$, and a third symbol that may include $a_2$ and $a_5$. Further, $a_0, a_1,$ and $a_2$ may be mapped to a same spatial layer and a same modulation level and $a_3, a_4,$ and $a_5$ may be mapped to a same spatial layer and a same modulation level. Bits mapped to a same spatial layer and a same modulation level may experience similar reliability. Further, a similar block-interleaver may also be implemented at the decoder 240 of a receiving device (e.g., the wireless device 205-b) such that the decoder 240 may perform error correction operations on the coded bits 215 (e.g., using LDPC codes).

Therefore, the above techniques may allow for coded bits 215 associated with a same variable node to be mapped to a same reliability level. Mapping the coded bits 215 in such a way may allow the decoder 240 to converge at a fast rate (e.g., when compared to the other methods). The decoder 240 may converge at a fast rate because symmetry in channel reliability exists between variable nodes which may result in some variable nodes converging faster at the decoder 240 which may aid other variable nodes (e.g., weaker nodes) to converge. Further, as described in detail in FIG. 4, a second block-interleaver may be applied prior to encoding in situations where probabilistic shaping is performed on the data bits 210. Additionally, as described in detail in FIG. 5, coded bits corresponding to a same variable node may be mapped to a same frequency hop, a same precoding resource block group (PRG), or a same physical resource block (PRB).

Figure 3:
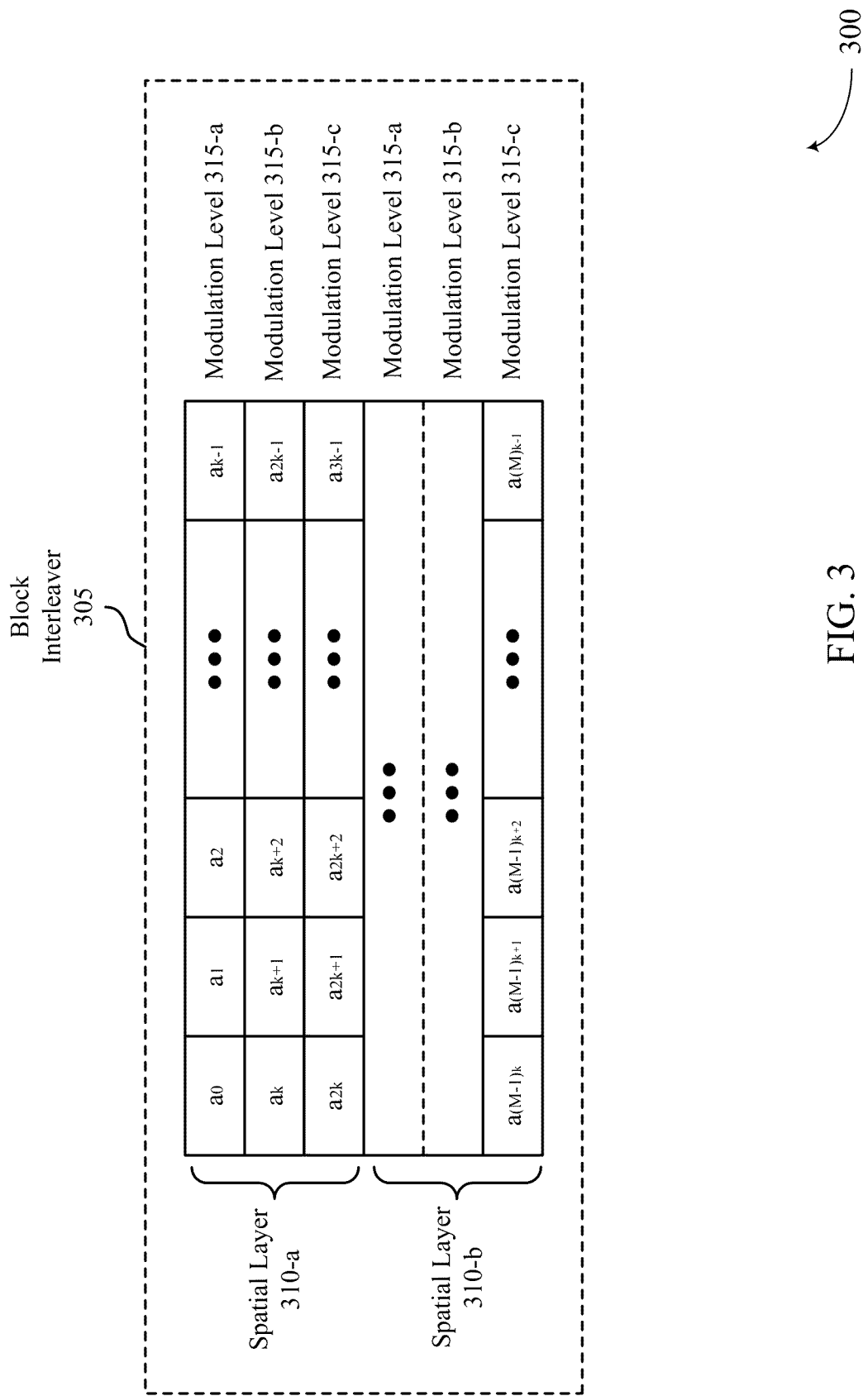
FIG. 3 illustrates an example of an interleaving scheme that supports techniques for mapping coded bits to different channel reliability levels for LDPC codes in accordance with one or more aspects of the present disclosure.

FIG. 3 illustrates an example of an interleaving scheme 300 that supports techniques for mapping coded bits to different channel reliability levels for LDPC codes in accordance with one or more aspects of the present disclosure. In some examples, the interleaving scheme 300 may be implemented by aspects of a wireless communications system 100 and a wireless communications system 200. For example, the interleaving scheme 300 may be implemented by a UE 115 or a network entity 105 as described with reference to FIG. 1. Further, the interleaving scheme 300 may be implemented by a wireless device 205 (e.g., a wireless device 205-a or a wireless device 205-b) as described with reference to FIG. 2.

As discussed in FIG. 2, a transmitting device may utilize a block-interleaver 305 to group together coded bits associated with a same variable node. A depth of the block-interleaver 305 may be based on a quantity of spatial layers and a modulation order. Further, a length of the block-interleaver 305 may be based on the quantity of subcarriers. For example, the depth of the block-interleaver 305 may be equal to the quantity of spatial layers multiplied by the modulation order as represented by variable M in FIG. 2 and the length may be equal to the quantity of subcarriers as represented by the variable K in FIG. 2.

In some examples, a total number of coded bits may be equal to the depth of the block-interleaver 305 multiplied by the length of the block-interleaver 305. For example, the coded bits may include $a_0, a_1, a_2, a_3, \ldots, a_{MK-1}$ and prior to entering the block-interleaver 305, the coded bits may be arranged in the following order $a_0, a_1, a_2, a_3, \ldots, a_{MK-1}$. In some examples, two or more adjacent coded bits (e.g., copies of a coded bit) may be associated with a same variable node of a base matrix. For example, coded bits $a_0$ through $a_{k-1}$ may be associated with a same variable node, coded bits a k through $a_{2k-1}$ may be associated with a same variable node, and so on. When being input into the block-interleaver 305, the coded bits may be inputted row-by-row. As such, the coded bits $a_0$ through $a_{k-1}$ may be inputted into a first row (e.g., top-most row of the block-interleaver 305) of the block-interleaver 305, coded bits a k through $a_{2k-1}$, may be inputted into a second row of the block-interleaver 305 (e.g., row directly below the first row), coded bits $a_{2k}$ through $a_{3k-1}$ may be inputted into the third row of the block-interleaver 305 (e.g., row directly below the second row), and so on (e.g., until all of the rows of the block-interleaver 305 are filled).

As illustrated in FIG. 3, the transmitting device may support two spatial layers 310 (e.g., a spatial layer 310-a and a spatial layer 310-b) and three modulation levels 315 (e.g., a modulation level 315-a, a modulation level 315-b, and a modulation level 315-c) resulting in block-interleaver depth of six. In such example, coded bits $a_0$ through $a_{k-1}$ may be inputted into a row corresponding to a modulation level 315-a (e.g., a MSB of a symbol) and a spatial layer 310-a, coded bits a k through $a_{2k-1}$ may be inputted into a row corresponding to a modulation level 315-b (e.g., an LSB of a symbol) and a spatial layer 310-a; coded bits $a_{2k}$ through $a_{3k-1}$ may be inputted into a row corresponding to a modulation level 315-c (e.g., a LSB of a symbol) and a spatial layer 310-a; coded bits $a_{3k}$ through $a_{4k-1}$ (e.g., not shown) may be inputted into a row corresponding to a modulation level 315-a (e.g., a MSB of a symbol) and a spatial layer 310-b; coded bits $a_{4k}$ through $a_{5k-1}$ (not shown) may be inputted into a row corresponding to a modulation level 315-b (e.g., a LSB of a symbol) and a spatial layer 310-b; and coded bits $a_{5k}$ through $a_{6k-1}$ may be inputted into a row corresponding to a modulation level 315-c (e.g., a MSB of a symbol) and a spatial layer 310-b. That is, each row may represent a different combination of spatial layer 310 and modulation level 315.

By inputting the coded bits row-by-row to the block interleaver 305 by row and outputting the coded bits from the block interleaver by column, the output of the block-interleaver 305 may allow the transmitting device to map coded bits associated with a same variable node to a same combination of spatial layer 310 and modulation level 315 (e.g., a same reliability level). For example, as a result of the block-interleaver 305, the transmitting device may map coded bit $a_0$ to an MSB of a first symbol, coded bit a k to a second MSB of the first symbol, and coded bit $a_{2k}$ to a third MSB of the first symbol. Further, the transmitting device may map coded bit $a_1$ to an MSB of a second symbol, coded bit $a_{k+1}$ to a second MSB of the second symbol, and coded bit $a_{2k+1}$ to a third MSB of the second symbol. Coded bits $a_0$ and $a_1$ correspond to a same variable node and as a result of the block-interleaver 305, the coded $a_0$ and $a_1$ are also mapped to a same reliability level (e.g., a same spatial layer 310 and a same modulation level 315). In some examples, the transmitting device may transmit more than one codeword (e.g., more than M×K coded bits). In such example, the transmitting device may apply the block-interleaver 305 separately for each codeword (e.g., among the spatial layers 310 associated with the codeword).

Figure 4:
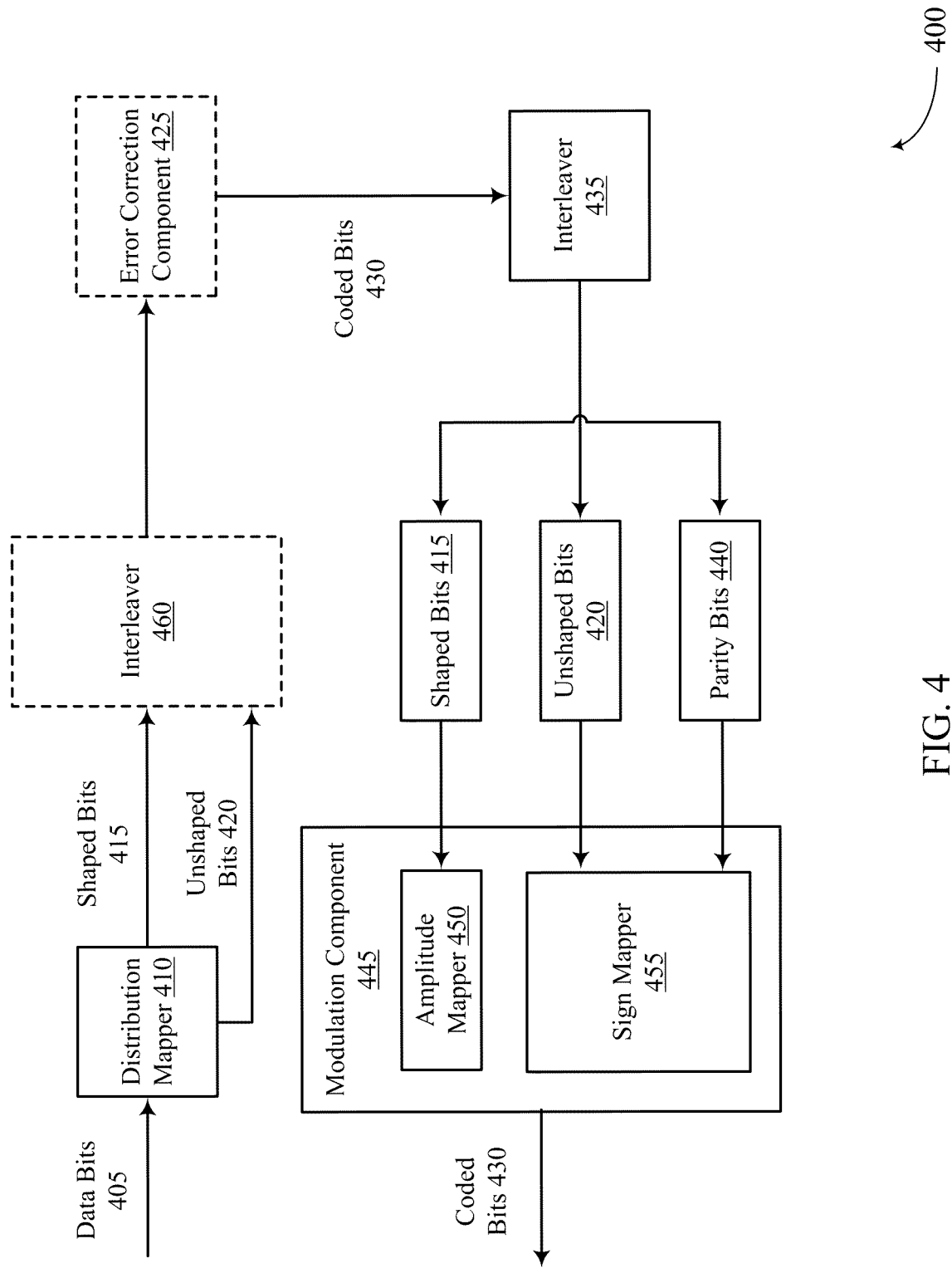
FIG. 4 illustrates an example of a probabilistic shaping scheme that supports techniques for mapping coded bits to different channel reliability levels for LDPC codes in accordance with one or more aspects of the present disclosure.

FIG. 4 illustrates an example of a probabilistic shaping scheme 400 that supports techniques for mapping coded bits to different channel reliability levels for LDPC codes in accordance with one or more aspects of the present disclosure. In some examples, the probabilistic shaping scheme 400 may be implemented by aspects of a wireless communications system 100 and a wireless communications system 200. For example, the probabilistic shaping scheme 400 may be implemented by a UE 115 or a network entity 105 as described with reference to FIG. 1. Further, the probabilistic shaping scheme 400 may be implemented by a wireless device 205 (e.g., a wireless device 205-a or a wireless device 205-b) as described with reference to FIG. 2.

In some examples, a transmitting device may perform probabilistic shaping. As described with reference to FIG. 2, during modulation, a transmitting device may map coded bits to a constellation or symbol, and for QAM constellations, each symbol may correspond to a unique combination of phase and amplitude. In conventional systems, each constellation point may have a same probability of being used. That is, constellations with a higher amplitude (e.g., outer constellation points in a constellation diagram) may have a same probability of being used as constellation points with a lower amplitude (e.g., inner constellation points in a constellation diagram). Transmitting a signal with a higher amplitude may use more power or energy and as such, utilizing higher amplitude constellations with a same probability as lower amplitude constellations may result in greater power or energy consumption. To remedy this, the transmitting device may apply probabilistic shaping to the data bits. Probabilistic shaping may allow the transmitting device to utilize lower power constellations more frequently than higher power constellation points which may result in performance gain for the transmitting. device As shown in FIG. 2, a set of data bits 405 (e.g., a uniform bit sequence) may be input into a distribution mapper 410. The distribution mapper 410 may take the data bits 405 with equal probability and convert these into symbols with a desired distribution. For example, the distribution mapper 410 may take a first portion of data bits 405 and output unshaped bits 415 (e.g., uniform distribution) and may take a second portion of the data bits 405 and output shaped bits 415 (e.g., non-uniform distribution) for a given probability distribution. The shaped bits 415 may correspond to either an imaginary or real amplitude portion of a symbol or constellation and the unshaped bits 420 may correspond to a sign portion of a symbol or constellation. The shaped bits 415 may be adjusted in such a way as to achieve the desired symbol distribution. After going through the distribution mapper 410, the order of the data bits 405 may be shaped bits corresponding to a real amplitude (e.g., codes bits $a_1, a_2, \ldots, a_{3200}$), shaped bits corresponding to an imaginary amplitude (e.g., codes bits $b_1, b_2, \ldots, b_{3200}$), and unshaped bits corresponding to a sign (e.g., (e.g., codes bits $c_1, c_2, \ldots, c_{2048}$).

In some examples, prior to undergoing error correction, the data bits 405 may be input into an interleaver 460. The interleaver 460 may group together data bits 405 that correspond to a same amplitude (e.g., imaginary part of the amplitude and real part of the amplitude) or a same variable node. For example, the output of the interleaver 460 may be $a_1, b_1, a_2, b_2, \ldots, a_{3200}, b_{3200}, c_1, c\ 2, \ldots, c_{2048}$. The data bits 405 may then enter the error correction component 425 and the output of the error correction component 425 may be coded bits 430. In some examples, the error correction component 425 may apply LDPC codes in order to generate the coded bits 430 as described with reference to FIG. 2. The coded bits 430 may include the data bits 405 as well as parity bits 440 and the order of the coded bits 430 may be $a_1, b_1, a_2, b_2, \ldots, a_{3200}, b_{3200}, c_1, c_2, \ldots, c_{2048}, d_1, d_2, \ldots, d_{1152}$, where $d_1, d_2, \ldots, d_{1152}$ are the parity bits.

Further, the coded bits 430 may undergo a second interleaving operation. For example, the coded bits 430 may be input into interleaver 435. In some examples, the interleaver 435 may be an example of the block-interleaver 305 as described with reference to FIG. 3. That is, the interleaver 435 may interleave the coded bits 430 in such a way that the coded bits corresponding to a same variable node are mapped to a same reliability level (e.g., a same modulation level). Further, the block interleaver 435 may interleave the coded bits 430 in such a way that the unshaped bits 420 (e.g., $c_1, c\ 2, \ldots, c_{2048}$) are mapped to a highest reliability level in terms of modulation (e.g., MSBs of the symbols). After exiting the interleaver 435, the coded bits 430 may flow to the modulation component 445. At the modulation component 445, the coded bits 430 may be mapped to modulation layers. For example, as shown in FIG. 4, the shaped bits 415 may be mapped to an amplitude using the amplitude mapper 450 of the modulation component 445 and the unshaped bits 420 as well as the parity bits 440 may be mapped to a sign using a sign mapper 455 of the modulation component 445. After modulation, the coded bits 430 may be transmitted to a receiving device. The receiving device may utilize similar components to decode the coded bits 430. For example, the receiving device may include a demodulation component, an interleaver 435, an error correction component 425, and a distribution mapper 410.

Figure 5:
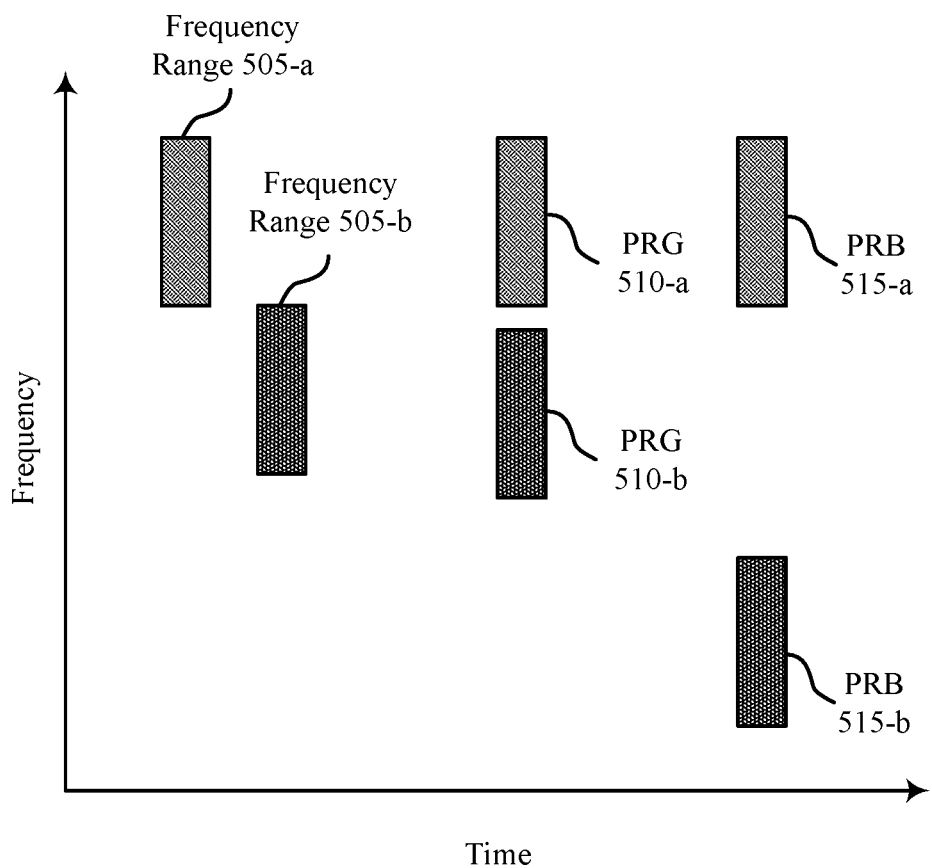
FIG. 5 illustrates an example of a resource mapping scheme that supports techniques for mapping coded bits to different channel reliability levels for LDPC codes in accordance with one or more aspects of the present disclosure.

FIG. 5 illustrates an example of a resource mapping scheme 500 that supports techniques for mapping coded bits to different channel reliability levels for LDPC codes in accordance with one or more aspects of the present disclosure. In some examples, the resource mapping scheme 500 may be implemented by aspects of a wireless communications system 100 and a wireless communications system 100. For examples, the resource mapping scheme 500 may be implemented by a UE 115 or a network entity 105 as described with reference to FIG. 1 or a wireless device 205 as described with reference to FIG. 2.

As described with reference to FIGS. 2 and 3, a transmitting device may utilize a block-interleaver such that coded bits corresponding to a base matrix (e.g., a base matrix for LDPC codes) may be mapped to a same reliability level (e.g., a same modulation level or a same spatial layer). Additionally, coded bits mapped to a same reliability level may be mapped to a same frequency hop, a same PRG 510, and a same PRB 515.

In some examples, a wireless device may operate according to a frequency hopping scheme. While operating according to a frequency hopping scheme, the wireless device may hop between available narrowband frequencies within a broad channel according to some pattern (e.g., a pseudo-random sequence). For example, as shown in FIG. 5, the wireless device may switch from a frequency range 505-a to a frequency range 505-b. The frequency range 505-a may represent a first hop and the frequency range 505-b may represent a second hop. In such example, the wireless device may assign or map coded bits of a set of coded bits corresponding to a first variable node to the frequency range 505-a and may not assign the coded bits corresponding to the first variable node the frequency range 505-b. Alternatively, the wireless device may assign or map coded bits of a set of coded bits corresponding to a first variable node to the frequency range 505-b and may not assign the coded bits corresponding to the first variable node the frequency range 505-a.

Additionally or alternatively, the wireless device may support different PRGs 510. In such example, the wireless device may apply a different precoder to different sets of REs. For example, as shown in FIG. 5, the wireless device may apply a first precoder to REs within PRG 510-a and the wireless device may apply a second precoder to REs with PRG 510-b. In such example, the wireless device may assign or map coded bits of a set of coded bits corresponding a first variable node to the PRG 510-a and may not assign the coded bits corresponding to the first variable node the PRG 510-b. Alternatively, the wireless device may assign or map coded bits of a set of coded bits corresponding to a first variable node to the PRG 510-b and may not assign the coded bits corresponding to the first variable node to the PRG 510-a.

In another examples, the wireless device may support distributed REs. For example, as shown in FIG. 5, a set of REs allocated for data transmission by the wireless device may be located within a PRB 515-a and the PRB 515-b. Further, the PRB 515-a may occupy a different frequency range when compared to the PRB 515-b. In such example, the wireless device may assign or map coded bits of a set of coded bits corresponding a first variable node to the PRB 515-a and may not assign the coded bits corresponding to the first variable node the PRB 515-b. Alternatively, the wireless device may assign or map coded bits of a set of coded bits corresponding to a first variable node to the PRB 515-b and may not assign the coded bits corresponding to the first variable node to the PRB 515-a. Different frequency ranges 505, PRGs 510, and PRBs 515 may be associated with different reliability. As such, mapping coded bits corresponding to a same variable node to a same frequency range 505, PRGs 510, and PRBs 515 may be associated with different reliability may increase an efficiency associated with decoding the coded bits.

Figure 6:
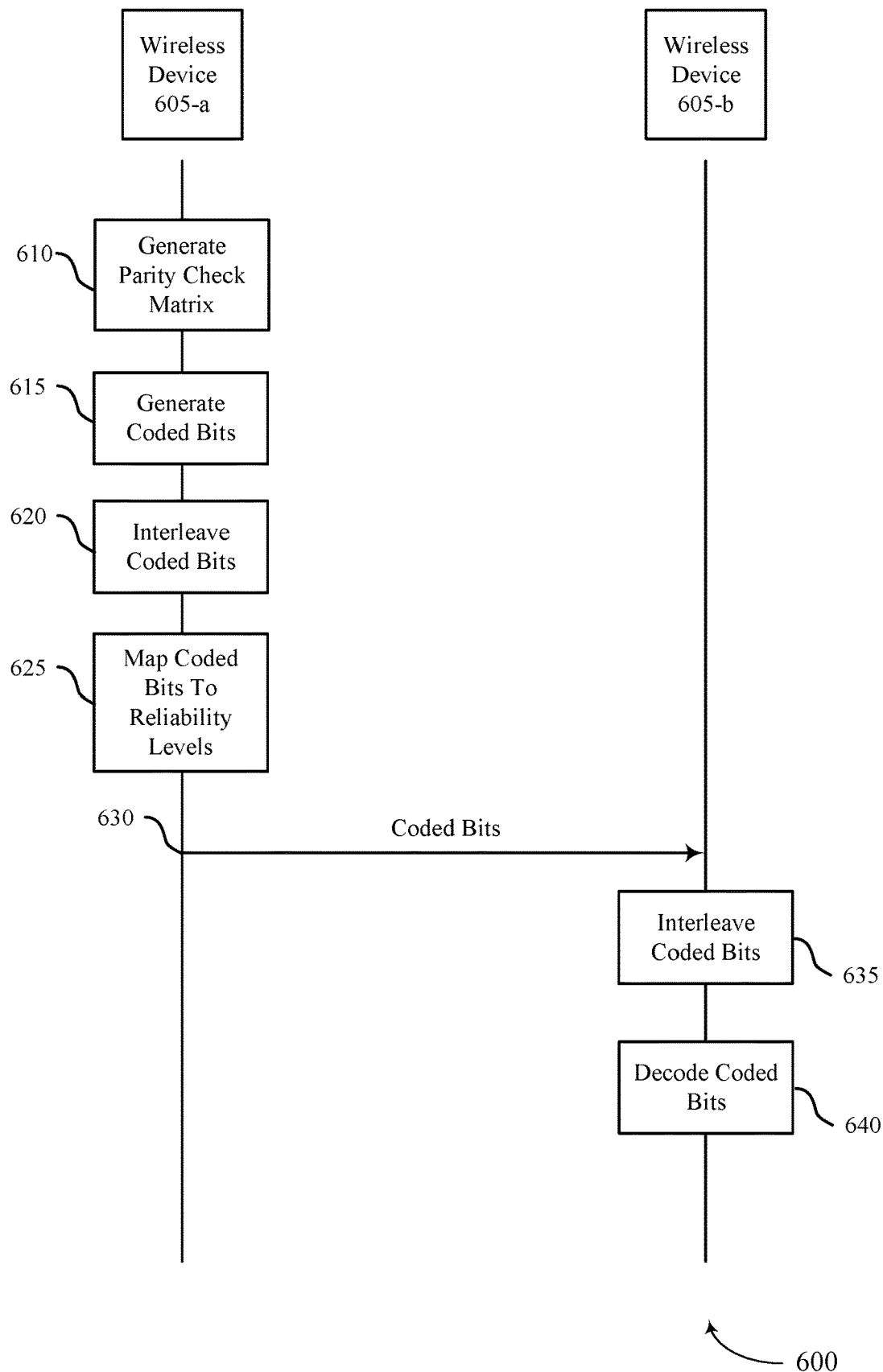
FIG. 6 illustrates an example of a process flow that supports techniques for mapping coded bits to different channel reliability levels for LDPC codes in accordance with one or more aspects of the present disclosure.

FIG. 6 illustrates an example of a process flow 600 that supports techniques for mapping coded bits to different channel reliability levels for LDPC codes in accordance with one or more aspects of the present disclosure. In some examples, the process flow 600 may implement or be implemented by aspects of a wireless communications system 100 and a wireless communications system 200. For example, the process flow 600 may be implemented by a wireless device 605-a and a wireless device 605-b which may be examples of a UE 115 or a wireless device 205 as described with reference to FIGS. 1 and 2, respectively. Alternative examples of the following may be implemented, where some steps are performed in a different order than described or are not performed at all. In some cases, steps may include additional features not mentioned below, or further steps may be added.

At 610, the wireless device 605-a may generate a parity check matrix. In some examples, the wireless device 605-a may generate the parity check matrix by performing a lifting operation on a base matrix. Each column of the base matrix may correspond to a different variable node and each row of the base matrix may correspond to a different check node.

At 615, the wireless device 605-a may generate a set of coded bits using the parity check matrix. In some examples, the set of coded bits may include a set of parity bits and a set of data bits. Each coded bit of the set of coded bits may correspond to a variable node of the of the base matrix. In some examples, prior to generating the set of coded bits, the wireless device may perform a probabilistic shaping operation on an information payload. The output of the probabilistic shaping operation may be the set of data bits that includes shaped bits (e.g., non-uniform distribution) and unshaped bits (e.g., uniform distribution). After performing the probabilistic shaping operation, the wireless device 605-a may interleave the set of data bits such that unshaped bits of the set of data bits corresponding to a same variable node are adjacent to one another in the bit sequence and shaped bits of the set of data bits corresponding to a same variable node are adjacent to one another in the bit sequence.

At 620, the wireless device 605-a may interleave the set of coded bits using, for example, a block-interleaver. In some examples, the wireless device 605-a may interleave the coded bits such that coded bits corresponding to a same variable node are grouped together (e.g., for a subsequent mapping operation). In some examples, the block interleaving may have a depth that is equal to a modulation order multiplied with a threshold quantity of spatial layers and a length that is equal to a threshold number of sub carriers.

At 625, the wireless device 605-a may perform a mapping operation of the set of coded bits. In one example, the mapping operation may include mapping a first subset of the set coded bits associated with a first variable node to a first spatial layer and mapping a second subset of the set of coded bits associated with a second variable node to a second spatial layer. Additionally, the wireless device 605-a may modulate the first subset of the set of coded bits such that the first subset of the set of coded bits corresponds a first modulation level and modulate the second subset of the set of coded bits such that the second subset of the set of coded corresponds to a second modulation level. In some examples, modulating the first subset of the set of coded bits may include mapping each coded bit of the first subset of set of coded bits to a MSB of a respective symbol. Additionally, the wireless device 605-a may map a set of parity bits of the set of coded bits corresponding to a same variable node to a first channel reliability level (e.g., modulation level or spatial layer) and map a set of data bits of the set of coded bits corresponding to a same variable node to a second channel reliability level. The second reliability level may be associated with a higher reliability than the first reliability.

At 630, the wireless device 605-a may transmit the set of coded bits to the wireless device 605-b in accordance with the mapping operation performed at 625. In some examples, the wireless device 605-a may transmit the first subset of the set of coded bits associated with the first variable node using a same frequency hop, a same PRG, or a same PRB.

At 635, the wireless device 605-b may receive the set of coded bits and interleave (e.g., deinterleave) the received set of coded bits. In some examples, the wireless device 605-b may interleave the set of coded bits such that the set of coded bits are in a correct format for error correction procedures at the wireless device 605-b. As one example, the wireless device 605-b may utilize a similar block-interleaver as the wireless device 605-a and as a result of inputting the set of coded bits into the block-interleaver, subsets of the set of coded bits corresponding to a same variable node may be grouped together. Further, the block-interleaver may have a depth equal to a modulation order multiplied by a threshold quantity of spatial layers and a length that is equal to a threshold number of subcarriers.

At 640, the wireless device 605-b may perform an error correction procedure on the set of coded bits to decode the set of coded bits and potentially correct any errors that may arise during transmission of the set of coded bits from the wireless device 605-a to the wireless device 605-b. As one example, the wireless device 605-b may utilize the parity check matrix along with the parity bits included in the set of coded bits to decode the set of data bits. Further, the wireless device 605-b may perform a second interleaving operation on the set of coded bits such that the coded bits are in a correct format (e.g., shaped bits corresponding to an imaginary amplitude are grouped together and shaped bits corresponding to a real amplitude are grouped together) to be decoded using a probabilistic operation (e.g., in the case that probabilistic shaping was performed at the wireless device 605-b). Further, the wireless device 605-b may perform a probabilistic operation (e.g., a deshaping operation) on the set of coded bits and decode the set of data bits.

Figure 7:
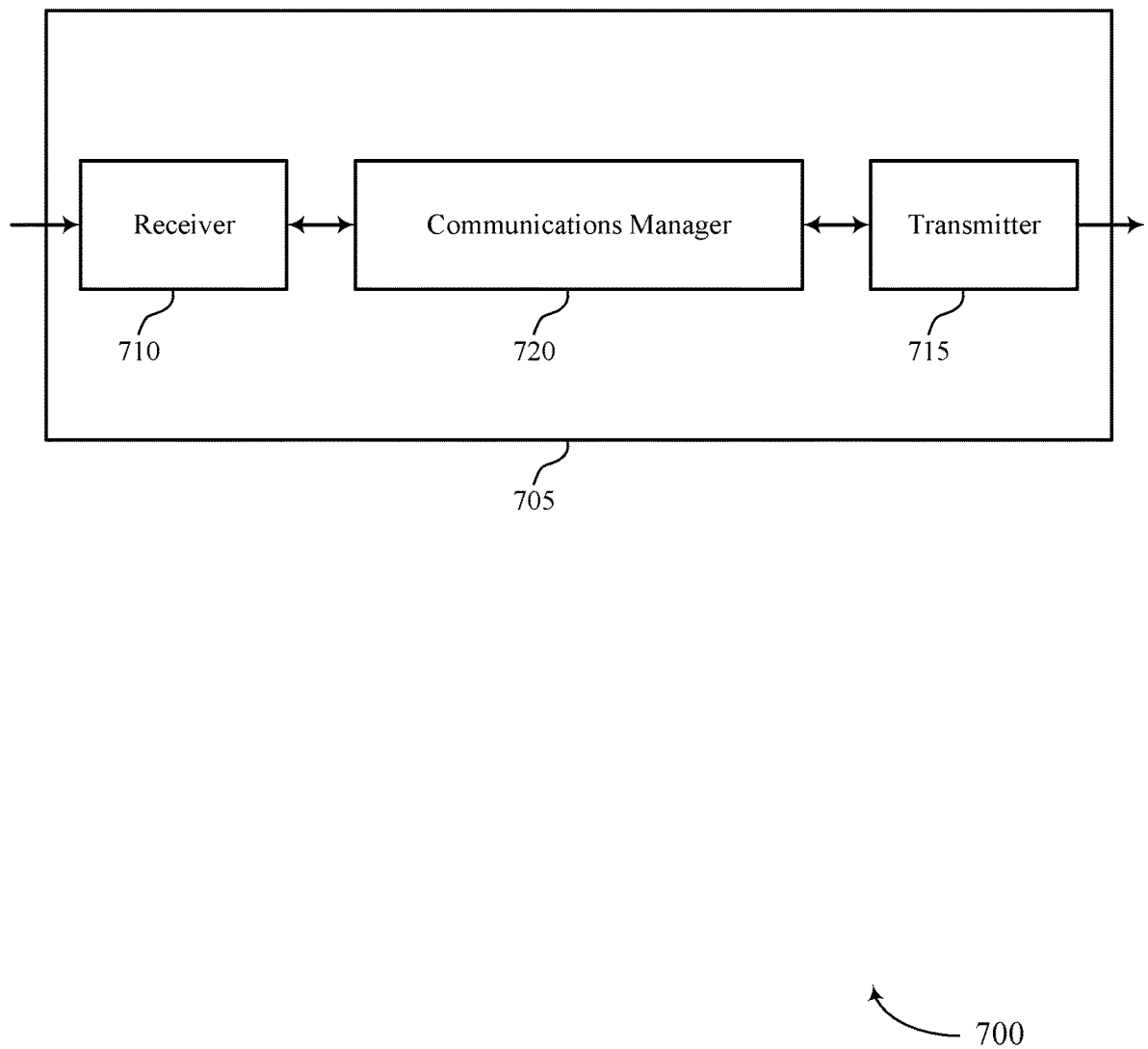
FIGS. 7 and 8 illustrate block diagrams of devices that support techniques for mapping coded bits to different channel reliability levels for LDPC codes in accordance with one or more aspects of the present disclosure.

FIG. 7 illustrates a block diagram 700 of a device 705 that supports techniques for mapping coded bits to different channel reliability levels for LDPC codes in accordance with one or more aspects of the present disclosure. The device 705 may be an example of aspects of a UE 115 or a network entity 105 as described herein. The device 705 may include a receiver 710, a transmitter 715, and a communications manager 720. The device 705 may also include a processor. Each of these components may be in communication with one another (e.g., via one or more buses).

The receiver 710 may provide a means for receiving information such as packets, user data, control information, or any combination thereof associated with various information channels (e.g., control channels, data channels, information channels related to techniques for mapping coded bits to different channel reliability levels for LDPC codes). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to techniques for mapping coded bits to different channel reliability levels for LDPC codes). In some examples, the transmitter 715 may be co-located with a receiver 710 in a transceiver module. The transmitter 715 may utilize a single antenna or a set of multiple antennas.

The communications manager 720, the receiver 710, the transmitter 715, or various combinations thereof or various components thereof may be examples of means for performing various aspects of techniques for mapping coded bits to different channel reliability levels for LDPC codes as described herein. For example, the communications manager 720, the receiver 710, the transmitter 715, or various combinations or components thereof may support a method for performing one or more of the functions described herein.

In some examples, the communications manager 720, the receiver 710, the transmitter 715, or various combinations or components thereof may be implemented in hardware (e.g., in communications management circuitry). The hardware may include a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 720, the receiver 710, the transmitter 715, or various combinations or components thereof may be implemented in code (e.g., as communications management software) executed by a processor. If implemented in code executed by a processor, the functions of the communications manager 720, the receiver 710, the transmitter 715, or various combinations or components thereof may be performed by a general-purpose processor, a DSP, a CPU, a graphics processing unit (GPU), an ASIC, an FPGA, a microcontroller, or any combination of these or other programmable logic devices (e.g., configured as or otherwise supporting a means for performing the functions described in the present disclosure).

In some examples, the communications manager 720 may be configured to perform various operations (e.g., receiving, obtaining, monitoring, outputting, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to obtain information, output information, or perform various other operations as described herein.

The communications manager 720 may support wireless communication at a wireless device (or transmitting device) in accordance with examples as disclosed herein. For example, the communications manager 720 may be configured as or otherwise support a means for generating a parity check matrix based on performing a lifting operation on a base matrix, where each column of the base matrix corresponds to a different variable node and each row corresponds to a different check node. The communications manager 720 may be configured as or otherwise support a means for generating a set of coded bits based on the parity check matrix, where the set of coded bits includes a set of data bits and a set of parity bits and each coded bit of the set of coded bits is associated with a respective variable node. The communications manager 720 may be configured as or otherwise support a means for interleaving the set of coded bits such that subsets of the set of coded bits associated with a same variable node are mapped to a same channel reliability level. The communications manager 720 may be configured as or otherwise support a means for transmitting the set of coded bits according to the interleaving.

Additionally, or alternatively, the communications manager 720 may support wireless communication at a wireless device (or receiving device) in accordance with examples as disclosed herein. For example, the communications manager 720 may be configured as or otherwise support a means for generating a parity check matrix based on performing a lifting operation on a base matrix, where each column of the base matrix corresponds to a different variable node and each row corresponds to a different check node. The communications manager 720 may be configured as or otherwise support a means for receiving a set of coded bits, where the set of coded bits includes a set of data bits and a set of parity bits and each coded bit of the set of coded bits is associated with a respective variable node. The communications manager 720 may be configured as or otherwise support a means for interleaving the set of coded bits such that subsets of the set of coded bits corresponding to a same variable node are mapped to same channel reliability level. The communications manager 720 may be configured as or otherwise support a means for decoding the set of data bits based on the set of parity bits and the parity check matrix.

By including or configuring the communications manager 720 in accordance with examples as described herein, the device 705 (e.g., a processor controlling or otherwise coupled with the receiver 710, the transmitter 715, the communications manager 720, or a combination thereof) may support techniques for reduced processing, and reduced power consumption.

Figure 8:
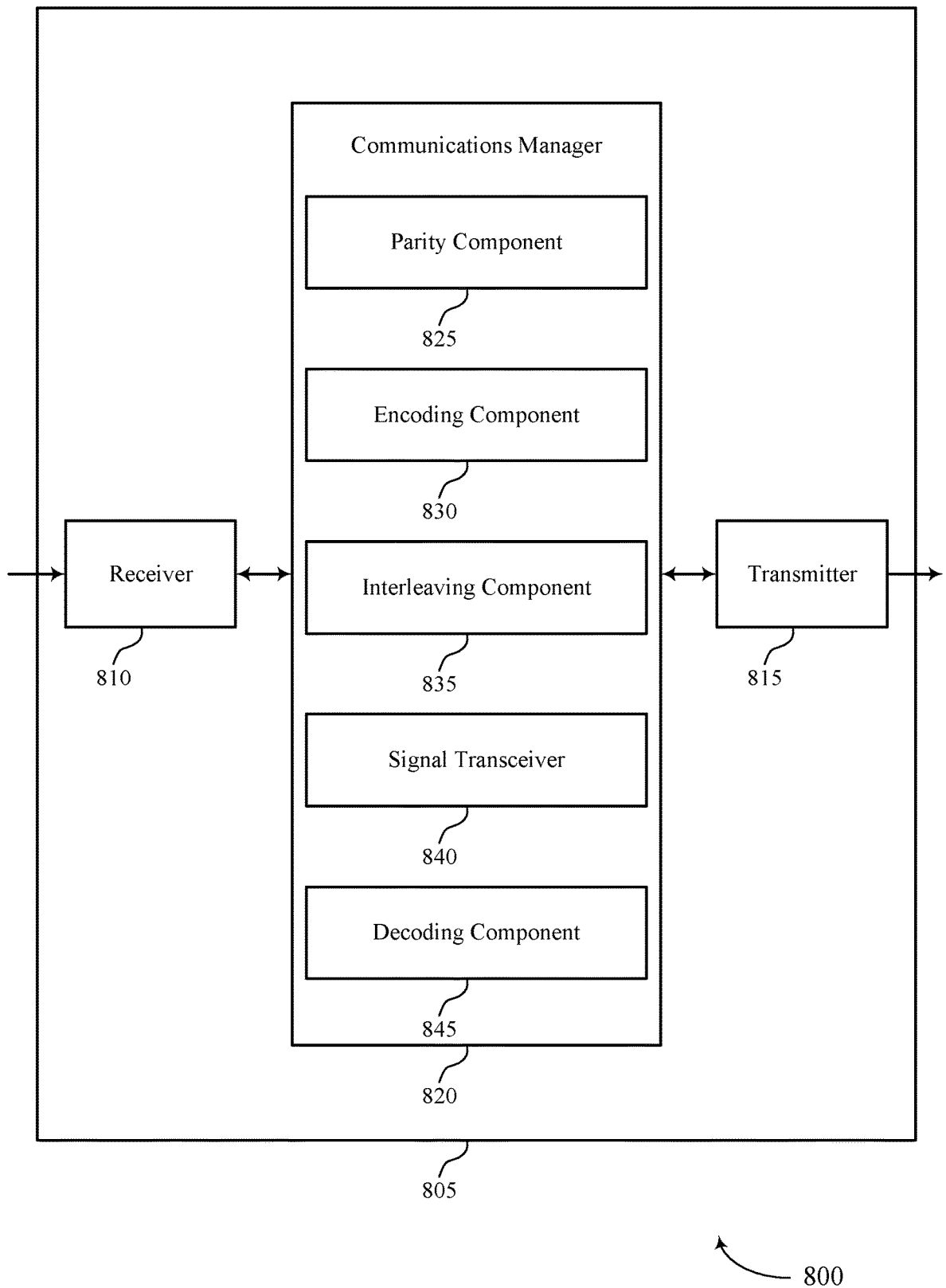

FIG. 8 illustrates a block diagram 800 of a device 805 that supports techniques for mapping coded bits to different channel reliability levels for LDPC codes in accordance with one or more aspects of the present disclosure. The device 805 may be an example of aspects of a device 705, a UE 115, or a network entity 105 as described herein. The device 805 may include a receiver 810, a transmitter 815, and a communications manager 820. The device 805 may also include a processor. Each of these components may be in communication with one another (e.g., via one or more buses).

The receiver 810 may provide a means for receiving information such as packets, user data, control information, or any combination thereof associated with various information channels (e.g., control channels, data channels, information channels related to techniques for mapping coded bits to different channel reliability levels for LDPC codes). Information may be passed on to other components of the device 805. The receiver 810 may utilize a single antenna or a set of multiple antennas.

The transmitter 815 may provide a means for transmitting signals generated by other components of the device 805. For example, the transmitter 815 may transmit information such as packets, user data, control information, or any combination thereof associated with various information channels (e.g., control channels, data channels, information channels related to techniques for mapping coded bits to different channel reliability levels for LDPC codes). In some examples, the transmitter 815 may be co-located with a receiver 810 in a transceiver module. The transmitter 815 may utilize a single antenna or a set of multiple antennas.

The device 805, or various components thereof, may be an example of means for performing various aspects of techniques for mapping coded bits to different channel reliability levels for LDPC codes as described herein. For example, the communications manager 820 may include a parity component 825, an encoding component 830, an interleaving component 835, a signal transceiver 840, a decoding component 845, or any combination thereof. The communications manager 820 may be an example of aspects of a communications manager 720 as described herein. In some examples, the communications manager 820, or various components thereof, may be configured to perform various operations (e.g., receiving, obtaining, monitoring, outputting, transmitting) using or otherwise in cooperation with the receiver 810, the transmitter 815, or both. For example, the communications manager 820 may receive information from the receiver 810, send information to the transmitter 815, or be integrated in combination with the receiver 810, the transmitter 815, or both to obtain information, output information, or perform various other operations as described herein.

The communications manager 820 may support wireless communication at a wireless device (or transmitting device) in accordance with examples as disclosed herein. The parity component 825 may be configured as or otherwise support a means for generating a parity check matrix based on performing a lifting operation on a base matrix, where each column of the base matrix corresponds to a different variable node and each row corresponds to a different check node. The encoding component 830 may be configured as or otherwise support a means for generating a set of coded bits based on the parity check matrix, where the set of coded bits includes a set of data bits and a set of parity bits and each coded bit of the set of coded bits is associated with a respective variable node. The interleaving component 835 may be configured as or otherwise support a means for interleaving the set of coded bits such that subsets of the set of coded bits associated with a same variable node are mapped to a same channel reliability level. The signal transceiver 840 may be configured as or otherwise support a means for transmitting the set of coded bits according to the interleaving.

Additionally, or alternatively, the communications manager 820 may support wireless communication at a wireless device (or receiving device) in accordance with examples as disclosed herein. The parity component 825 may be configured as or otherwise support a means for generating a parity check matrix based on performing a lifting operation on a base matrix, where each column of the base matrix corresponds to a different variable node and each row corresponds to a different check node. The signal transceiver 840 may be configured as or otherwise support a means for receiving a set of coded bits, where the set of coded bits includes a set of data bits and a set of parity bits and each coded bit of the set of coded bits is associated with a respective variable node. The interleaving component 835 may be configured as or otherwise support a means for interleaving the set of coded bits such that subsets of the set of coded bits corresponding to a same variable node are mapped to same channel reliability level. The decoding component 845 may be configured as or otherwise support a means for decoding the set of data bits based on the set of parity bits and the parity check matrix.

Figure 9:
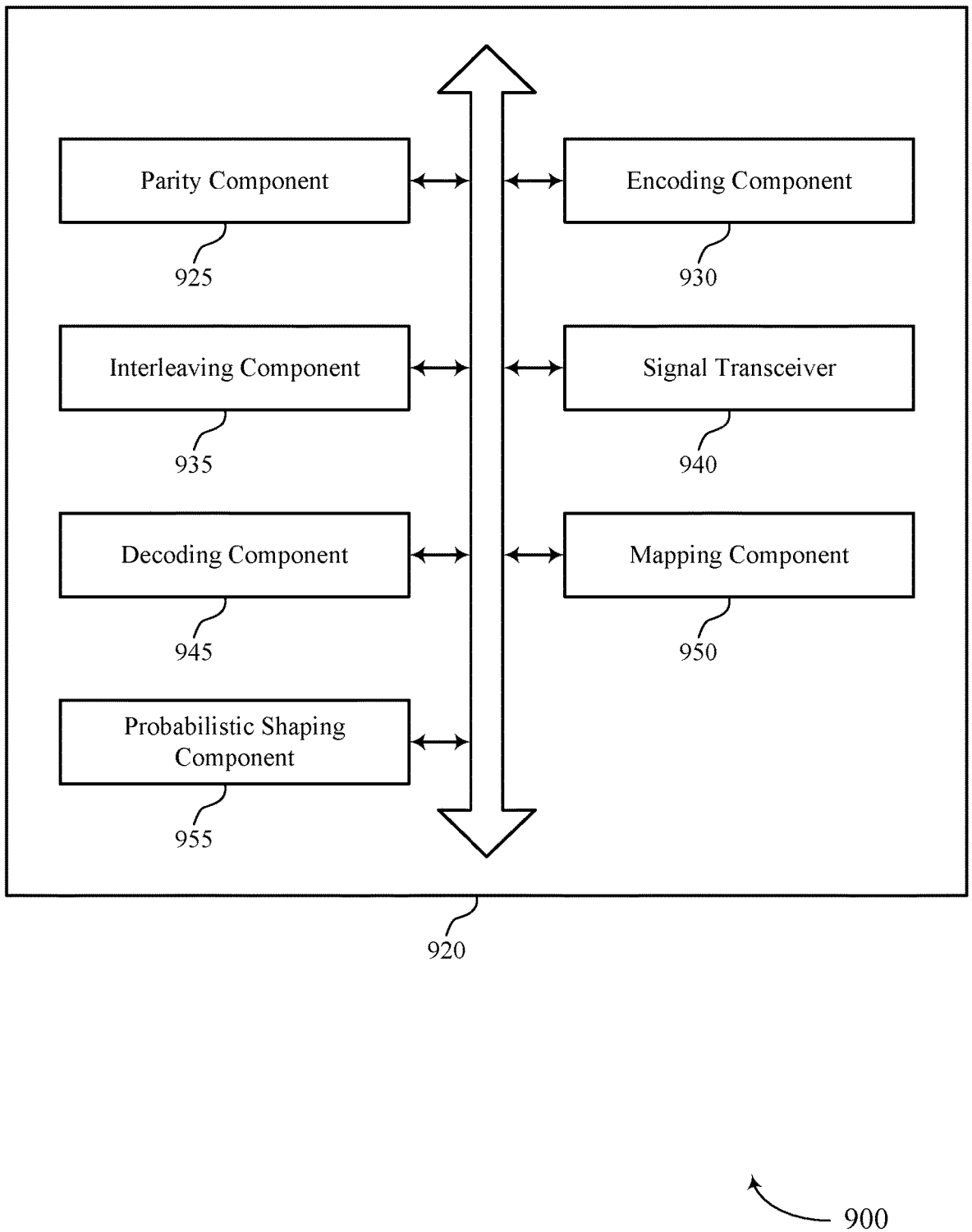
FIG. 9 illustrates a block diagram of a communications manager that supports techniques for mapping coded bits to different channel reliability levels for LDPC codes in accordance with one or more aspects of the present disclosure.

FIG. 9 illustrates a block diagram 900 of a communications manager 920 that supports techniques for mapping coded bits to different channel reliability levels for LDPC codes in accordance with one or more aspects of the present disclosure. The communications manager 920 may be an example of aspects of a communications manager 720, a communications manager 820, or both, as described herein. The communications manager 920, or various components thereof, may be an example of means for performing various aspects of techniques for mapping coded bits to different channel reliability levels for LDPC codes as described herein. For example, the communications manager 920 may include a parity component 925, an encoding component 930, an interleaving component 935, a signal transceiver 940, a decoding component 945, a mapping component 950, a probabilistic shaping component 955, or any combination thereof. Each of these components may communicate, directly or indirectly, with one another (e.g., via one or more buses).

The communications manager 920 may support wireless communication at a wireless device (or transmitting device) in accordance with examples as disclosed herein. The parity component 925 may be configured as or otherwise support a means for generating a parity check matrix based on performing a lifting operation on a base matrix, where each column of the base matrix corresponds to a different variable node and each row corresponds to a different check node. The encoding component 930 may be configured as or otherwise support a means for generating a set of coded bits based on the parity check matrix, where the set of coded bits includes a set of data bits and a set of parity bits and each coded bit of the set of coded bits is associated with a respective variable node. The interleaving component 935 may be configured as or otherwise support a means for interleaving the set of coded bits such that subsets of the set of coded bits associated with a same variable node are mapped to a same channel reliability level. The signal transceiver 940 may be configured as or otherwise support a means for transmitting the set of coded bits according to the interleaving.

In some examples, the mapping component 950 may be configured as or otherwise support a means for mapping a first subset of the set of coded bits associated with a first variable node to a first spatial layer based on interleaving the set of coded bits.

In some examples, the mapping component 950 may be configured as or otherwise support a means for mapping a second subset of the set of coded bits associated with a second variable node to a second spatial layer based on interleaving the set of coded bits.

In some examples, the mapping component 950 may be configured as or otherwise support a means for mapping at least a portion of a second subset of the set of coded bits associated with a second variable node to the first spatial layer based on interleaving the set of coded bits, where the second variable node is adjacent to the first variable node in the base matrix.

In some examples, the mapping component 950 may be configured as or otherwise support a means for modulating a first subset of the set of coded bits associated with a first variable node such that the first subset of the set of coded bits corresponds to a first modulation level based on interleaving the set of coded bits.

In some examples, the mapping component 950 may be configured as or otherwise support a means for mapping the first subset of the set of coded bits to a first spatial layer based on interleaving the set of coded bits.

In some examples, to support transmitting the set of coded bits, the signal transceiver 940 may be configured as or otherwise support a means for transmitting a first subset of the set of coded bits associated with a first variable node using a same frequency hop, a same PRG, or a same PRB.

In some examples, the probabilistic shaping component 955 may be configured as or otherwise support a means for generating a set of shaped bits and a set of unshaped bits based on performing a probabilistic shaping operation, where the set of data bits includes the set of unshaped bits and the set of shaped bits. In some examples, the interleaving component 935 may be configured as or otherwise support a means for interleaving, prior to generating the set of coded bits, the set of data bits such that subsets of the set of shaped bits associated with a same variable node are mapped to a same channel reliability level.

In some examples, the mapping component 950 may be configured as or otherwise support a means for mapping each unshaped bit of the set of unshaped bits to a most significant bit (MSB) of a respective symbol.

In some examples, an interleaver used to perform the interleaving of the set of coded bits includes a block-interleaver. In some examples, the block-interleaver has a depth that is equal to a modulation order multiplied with a threshold quantity of spatial layers and a length that is equal to a threshold number of subcarriers.

Additionally, or alternatively, the communications manager 920 may support wireless communication at a wireless device (or receiving device) in accordance with examples as disclosed herein. In some examples, the parity component 925 may be configured as or otherwise support a means for generating a parity check matrix based on performing a lifting operation on a base matrix, where each column of the base matrix corresponds to a different variable node and each row corresponds to a different check node. In some examples, the signal transceiver 940 may be configured as or otherwise support a means for receiving a set of coded bits, where the set of coded bits includes a set of data bits and a set of parity bits and each coded bit of the set of coded bits is associated with a respective variable node. In some examples, the interleaving component 935 may be configured as or otherwise support a means for interleaving the set of coded bits such that subsets of the set of coded bits corresponding to a same variable node are mapped to same channel reliability level. The decoding component 945 may be configured as or otherwise support a means for decoding the set of data bits based on the set of parity bits and the parity check matrix.

In some examples, to support receiving the set of coded bits, the signal transceiver 940 may be configured as or otherwise support a means for receiving a first subset of the set of coded bits associated with a first variable node via a first spatial layer.

In some examples, to support receiving the set of coded bits, the signal transceiver 940 may be configured as or otherwise support a means for receiving a second subset of the set of coded bits associated with a second variable node via a second spatial layer.

In some examples, to support receiving the set of coded bits, the signal transceiver 940 may be configured as or otherwise support a means for receiving at least a portion of a second subset of the set of coded bits associated with a second variable node via the first spatial layer, where the second variable node is adjacent to the first variable node in the base matrix.

In some examples, the signal transceiver 940 may be configured as or otherwise support a means for demodulating a set of symbols, where a first modulation level corresponds to a first subset of the set of coded bits that is associated with a first variable node.

In some examples, to support receiving the set of coded bits, the signal transceiver 940 may be configured as or otherwise support a means for receiving the first subset of the set of coded bits via a first spatial layer.

In some examples, to support receiving the set of coded bits, the signal transceiver 940 may be configured as or otherwise support a means for receiving a first subset of the set of coded bits associated with a first variable node using a same frequency hop, a same PRG, or a same PRB.

In some examples, the interleaving component 935 may be configured as or otherwise support a means for interleaving, after determining the set of data bits, a set of shaped bits such that a first subset of the set of shaped bits corresponding to an imaginary part of an amplitude are grouped together and a second subset of the set of shaped bits corresponding to a real part of the amplitude are grouped together, where the set of data bits includes the set of shaped bits and a set of unshaped bits. In some examples, the probabilistic shaping component 955 may be configured as or otherwise support a means for performing a probabilistic shaping operation on the set of data bits.

In some examples, an interleaver used to perform the interleaving of the set of coded bits includes a block-interleaver.

In some examples, the block-interleaver has a depth that is equal to a modulation order multiplied by a threshold quantity of spatial layers and a length that is equal to a threshold number of subcarriers.

Figure 10:
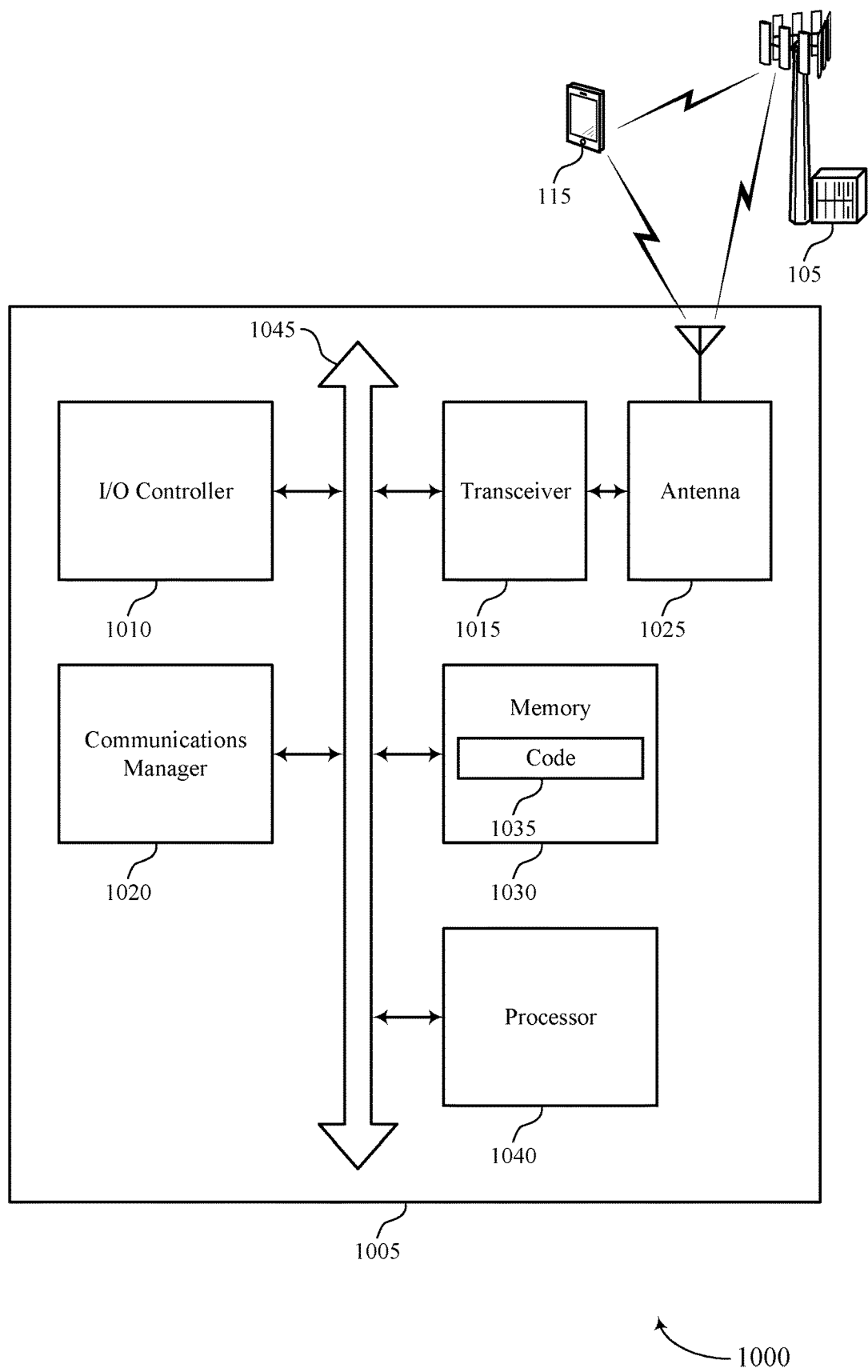
FIG. 10 illustrates a diagram of a system including a UE that supports techniques for mapping coded bits to different channel reliability levels for LDPC codes in accordance with one or more aspects of the present disclosure.

FIG. 10 illustrates a diagram of a system 1000 including a device 1005 that supports techniques for mapping coded bits to different channel reliability levels for LDPC codes in accordance with one or more aspects of the present disclosure. The device 1005 may be an example of or include the components of a device 705, a device 805, or a UE 115 as described herein. The device 1005 may communicate (e.g., wirelessly) with one or more network entities 105, one or more UEs 115, or any combination thereof. The device 1005 may include components for bi-directional voice and data communications including components for transmitting and receiving communications, such as a communications manager 1020, an input/output (I/O) controller 1010, a transceiver 1015, an antenna 1025, a memory 1030, code 1035, and a processor 1040. These components may be in electronic communication or otherwise coupled (e.g., operatively, communicatively, functionally, electronically, electrically) via one or more buses (e.g., a bus 1045).

The I/O controller 1010 may manage input and output signals for the device 1005. The I/O controller 1010 may also manage peripherals not integrated into the device 1005. In some cases, the I/O controller 1010 may represent a physical connection or port to an external peripheral. In some cases, the I/O controller 1010 may utilize an operating system such as iOS®, ANDROID®, MS-DOS®, MS-WINDOWS®, OS/2®, UNIX®, LINUX®, or another known operating system. Additionally or alternatively, the I/O controller 1010 may represent or interact with a modem, a keyboard, a mouse, a touchscreen, or a similar device. In some cases, the I/O controller 1010 may be implemented as part of a processor, such as the processor 1040. In some cases, a user may interact with the device 1005 via the I/O controller 1010 or via hardware components controlled by the I/O controller 1010.

In some cases, the device 1005 may include a single antenna 1025. However, in some other cases, the device 1005 may have more than one antenna 1025, which may be capable of concurrently transmitting or receiving multiple wireless transmissions. The transceiver 1015 may communicate bi-directionally, via the one or more antennas 1025, wired, or wireless links as described herein. For example, the transceiver 1015 may represent a wireless transceiver and may communicate bi-directionally with another wireless transceiver. The transceiver 1015 may also include a modem to modulate the packets, to provide the modulated packets to one or more antennas 1025 for transmission, and to demodulate packets received from the one or more antennas 1025. The transceiver 1015, or the transceiver 1015 and one or more antennas 1025, may be an example of a transmitter 715, a transmitter 815, a receiver 710, a receiver 810, or any combination thereof or component thereof, as described herein.

The memory 1030 may include random access memory (RAM) and read-only memory (ROM). The memory 1030 may store computer-readable, computer-executable code 1035 including instructions that, when executed by the processor 1040, cause the device 1005 to perform various functions described herein. The code 1035 may be stored in a non-transitory computer-readable medium such as system memory or another type of memory. In some cases, the code 1035 may not be directly executable by the processor 1040 but may cause a computer (e.g., when compiled and executed) to perform functions described herein. In some cases, the memory 1030 may contain, among other things, a basic I/O system (BIOS) which may control basic hardware or software operation such as the interaction with peripheral components or devices.

The processor 1040 may include an intelligent hardware device (e.g., a general-purpose processor, a DSP, a CPU, a GPU, a microcontroller, an ASIC, an FPGA, a programmable logic device, a discrete gate or transistor logic component, a discrete hardware component, or any combination thereof). In some cases, the processor 1040 may be configured to operate a memory array using a memory controller. In some other cases, a memory controller may be integrated into the processor 1040. The processor 1040 may be configured to execute computer-readable instructions stored in a memory (e.g., the memory 1030) to cause the device 1005 to perform various functions (e.g., functions or tasks supporting techniques for mapping coded bits to different channel reliability levels for LDPC codes). For example, the device 1005 or a component of the device 1005 may include a processor 1040 and memory 1030 coupled with or to the processor 1040, the processor 1040 and memory 1030 configured to perform various functions described herein.

The communications manager 1020 may support wireless communication at a wireless device (or transmitting device) in accordance with examples as disclosed herein. For example, the communications manager 1020 may be configured as or otherwise support a means for generating a parity check matrix based on performing a lifting operation on a base matrix, where each column of the base matrix corresponds to a different variable node and each row corresponds to a different check node. The communications manager 1020 may be configured as or otherwise support a means for generating a set of coded bits based on the parity check matrix, where the set of coded bits includes a set of data bits and a set of parity bits and each coded bit of the set of coded bits is associated with a respective variable node. The communications manager 1020 may be configured as or otherwise support a means for interleaving the set of coded bits such that subsets of the set of coded bits associated with a same variable node are mapped to a same channel reliability level. The communications manager 1020 may be configured as or otherwise support a means for transmitting the set of coded bits according to the interleaving.

Additionally, or alternatively, the communications manager 1020 may support wireless communication at a wireless device (or receiving device) in accordance with examples as disclosed herein. For example, the communications manager 1020 may be configured as or otherwise support a means for generating a parity check matrix based on performing a lifting operation on a base matrix, where each column of the base matrix corresponds to a different variable node and each row corresponds to a different check node. The communications manager 1020 may be configured as or otherwise support a means for receiving a set of coded bits, where the set of coded bits includes a set of data bits and a set of parity bits and each coded bit of the set of coded bits is associated with a respective variable node. The communications manager 1020 may be configured as or otherwise support a means for interleaving the set of coded bits such that subsets of the set of coded bits corresponding to a same variable node are mapped to same channel reliability level. The communications manager 1020 may be configured as or otherwise support a means for decoding the set of data bits based on the set of parity bits and the parity check matrix.

By including or configuring the communications manager 1020 in accordance with examples as described herein, the device 1005 may support techniques for improved user experience related to reduced processing, reduced power consumption, and improved utilization of processing capability.

In some examples, the communications manager 1020 may be configured to perform various operations (e.g., receiving, monitoring, transmitting) using or otherwise in cooperation with the transceiver 1015, the one or more antennas 1025, or any combination thereof. Although the communications manager 1020 is illustrated as a separate component, in some examples, one or more functions described with reference to the communications manager 1020 may be supported by or performed by the processor 1040, the memory 1030, the code 1035, or any combination thereof. For example, the code 1035 may include instructions executable by the processor 1040 to cause the device 1005 to perform various aspects of techniques for mapping coded bits to different channel reliability levels for LDPC codes as described herein, or the processor 1040 and the memory 1030 may be otherwise configured to perform or support such operations.

Figure 11:
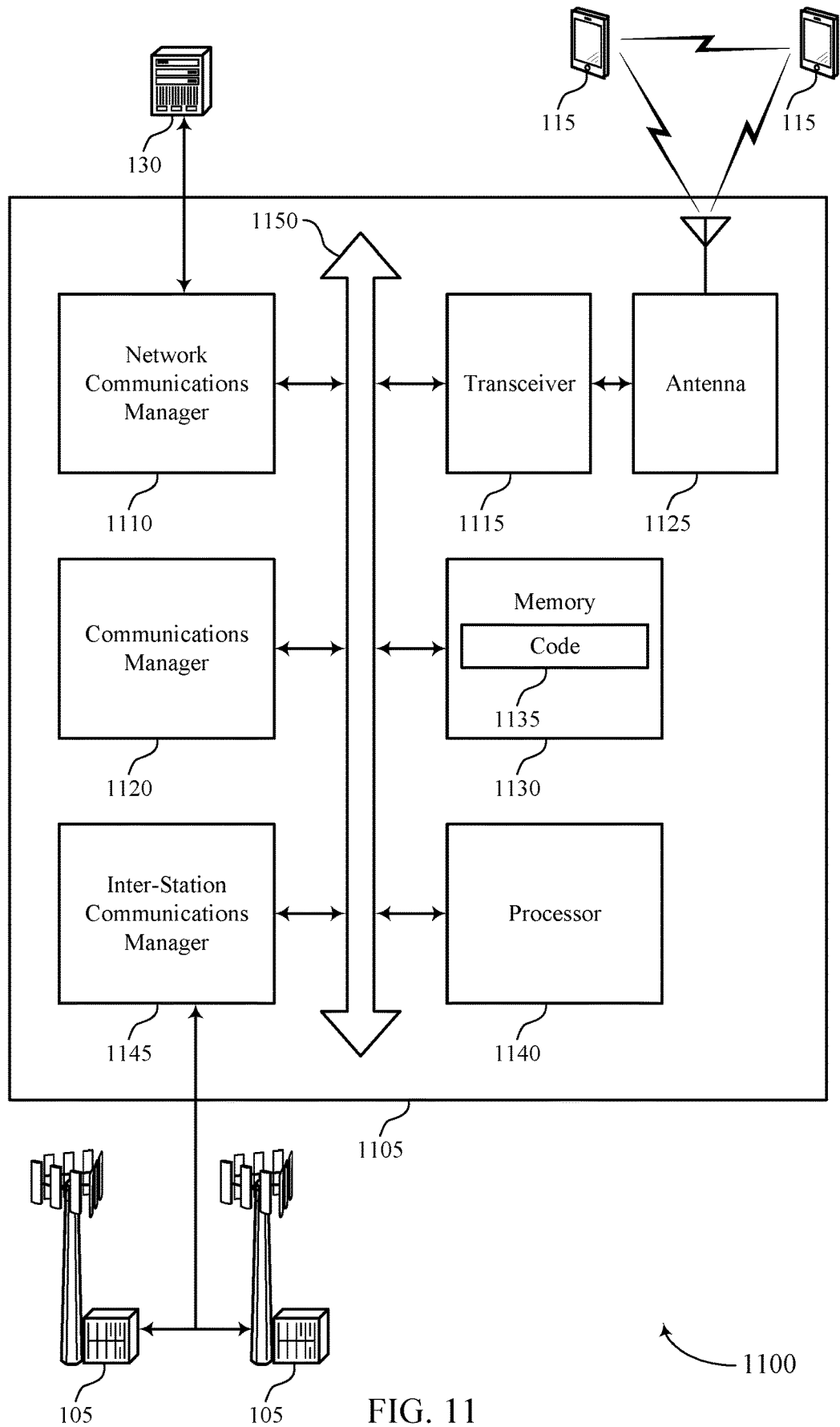
FIG. 11 illustrates a diagram of a system including a network entity that supports techniques for mapping coded bits to different channel reliability levels for LDPC codes in accordance with one or more aspects of the present disclosure.

FIG. 11 illustrates a diagram of a system 1100 including a device 1105 that supports techniques for mapping coded bits to different channel reliability levels for LDPC codes in accordance with one or more aspects of the present disclosure. The device 1105 may be an example of or include the components of a device 705, a device 805, or a network entity 105 as described herein. The device 1105 may communicate (e.g., wirelessly) with one or more network entities 105, one or more UEs 115, or any combination thereof. The device 1105 may include components for bi-directional voice and data communications including components for transmitting and receiving communications, such as a communications manager 1120, a network communications manager 1110, a transceiver 1115, an antenna 1125, a memory 1130, code 1135, a processor 1140, and an inter-station communications manager 1145. These components may be in electronic communication or otherwise coupled (e.g., operatively, communicatively, functionally, electronically, electrically) via one or more buses (e.g., a bus 1150).

The network communications manager 1110 may manage communications with a core network 130 (e.g., via one or more wired backhaul links). For example, the network communications manager 1110 may manage the transfer of data communications for client devices, such as one or more UEs 115.

In some cases, the device 1105 may include a single antenna 1125. However, in some other cases the device 1105 may have more than one antenna 1125, which may be capable of concurrently transmitting or receiving multiple wireless transmissions. The transceiver 1115 may communicate bi-directionally, via the one or more antennas 1125, wired, or wireless links as described herein. For example, the transceiver 1115 may represent a wireless transceiver and may communicate bi-directionally with another wireless transceiver. The transceiver 1115 may also include a modem to modulate the packets, to provide the modulated packets to one or more antennas 1125 for transmission, and to demodulate packets received from the one or more antennas 1125. The transceiver 1115, or the transceiver 1115 and one or more antennas 1125, may be an example of a transmitter 715, a transmitter 815, a receiver 710, a receiver 810, or any combination thereof or component thereof, as described herein.

The memory 1130 may include RAM and ROM. The memory 1130 may store computer-readable, computer-executable code 1135 including instructions that, when executed by the processor 1140, cause the device 1105 to perform various functions described herein. The code 1135 may be stored in a non-transitory computer-readable medium such as system memory or another type of memory. In some cases, the code 1135 may not be directly executable by the processor 1140 but may cause a computer (e.g., when compiled and executed) to perform functions described herein. In some cases, the memory 1130 may contain, among other things, a BIOS which may control basic hardware or software operation such as the interaction with peripheral components or devices.

The processor 1140 may be any one or more suitable processors capable of executing scripts or instructions of one or more software programs stored in the device 1105 (such as within the memory 1130). In some implementations, the processor 1140 may be a component of a processing system. A processing system may generally refer to a system or series of machines or components that receives inputs and processes the inputs to produce a set of outputs (which may be passed to other systems or components of, for example, the device 1105). For example, a processing system of the device 1105 may refer to a system including the various other components or subcomponents of the device 1105, such as the processor 1140, or the transceiver 1115, or the communications manager 1120, or other components or combinations of components of the device 1105. The processing system of the device 1105 may interface with other components of the device 1105, and may process information received from other components (such as inputs or signals) or output information to other components. For example, a chip or modem of the device 1105 may include a processing system and one or more interfaces to output information, or to obtain information, or both. The one or more interfaces may be implemented as or otherwise include a first interface configured to output information and a second interface configured to obtain information, or a same interface configured to output information and to obtain information, among other implementations. In some implementations, the one or more interfaces may refer to an interface between the processing system of the chip or modem and a transmitter, such that the device 1105 may transmit information output from the chip or modem. Additionally, or alternatively, in some implementations, the one or more interfaces may refer to an interface between the processing system of the chip or modem and a receiver, such that the device 1105 may obtain information or signal inputs, and the information may be passed to the processing system. A person having ordinary skill in the art will readily recognize that a first interface also may obtain information or signal inputs, and a second interface also may output information or signal outputs.

The inter-station communications manager 1145 may manage communications with other network entities 105, and may include a controller or scheduler for controlling communications with UEs 115 in cooperation with other network entities 105. For example, the inter-station communications manager 1145 may coordinate scheduling for transmissions to UEs 115 for various interference mitigation techniques such as beamforming or joint transmission. In some examples, the inter-station communications manager 1145 may provide an X2 interface within an LTE/LTE-A wireless communications network technology to provide communication between network entities 105.

The communications manager 1120 may support wireless communication at a wireless device (or transmitting device) in accordance with examples as disclosed herein. For example, the communications manager 1120 may be configured as or otherwise support a means for generating a parity check matrix based on performing a lifting operation on a base matrix, where each column of the base matrix corresponds to a different variable node and each row corresponds to a different check node. The communications manager 1120 may be configured as or otherwise support a means for generating a set of coded bits based on the parity check matrix, where the set of coded bits includes a set of data bits and a set of parity bits and each coded bit of the set of coded bits is associated with a respective variable node. The communications manager 1120 may be configured as or otherwise support a means for interleaving the set of coded bits such that subsets of the set of coded bits associated with a same variable node are mapped to a same channel reliability level. The communications manager 1120 may be configured as or otherwise support a means for transmitting the set of coded bits according to the interleaving.

Additionally, or alternatively, the communications manager 1120 may support wireless communication at a wireless device (or receiving device) in accordance with examples as disclosed herein. For example, the communications manager 1120 may be configured as or otherwise support a means for generating a parity check matrix based on performing a lifting operation on a base matrix, where each column of the base matrix corresponds to a different variable node and each row corresponds to a different check node. The communications manager 1120 may be configured as or otherwise support a means for receiving a set of coded bits, where the set of coded bits includes a set of data bits and a set of parity bits and each coded bit of the set of coded bits is associated with a respective variable node. The communications manager 1120 may be configured as or otherwise support a means for interleaving the set of coded bits such that subsets of the set of coded bits corresponding to a same variable node are mapped to same channel reliability level. The communications manager 1120 may be configured as or otherwise support a means for decoding the set of data bits based on the set of parity bits and the parity check matrix.

By including or configuring the communications manager 1120 in accordance with examples as described herein, the device 1105 may support techniques for improved user experience related to reduced processing, reduced power consumption, and improved utilization of processing capability.

In some examples, the communications manager 1120 may be configured to perform various operations (e.g., receiving, monitoring, transmitting) using or otherwise in cooperation with the transceiver 1115, the one or more antennas 1125, or any combination thereof. Although the communications manager 1120 is illustrated as a separate component, in some examples, one or more functions described with reference to the communications manager 1120 may be supported by or performed by the processor 1140, the memory 1130, the code 1135, or any combination thereof. For example, the code 1135 may include instructions executable by the processor 1140 to cause the device 1105 to perform various aspects of techniques for mapping coded bits to different channel reliability levels for LDPC codes as described herein, or the processor 1140 and the memory 1130 may be otherwise configured to perform or support such operations.

Figure 12:
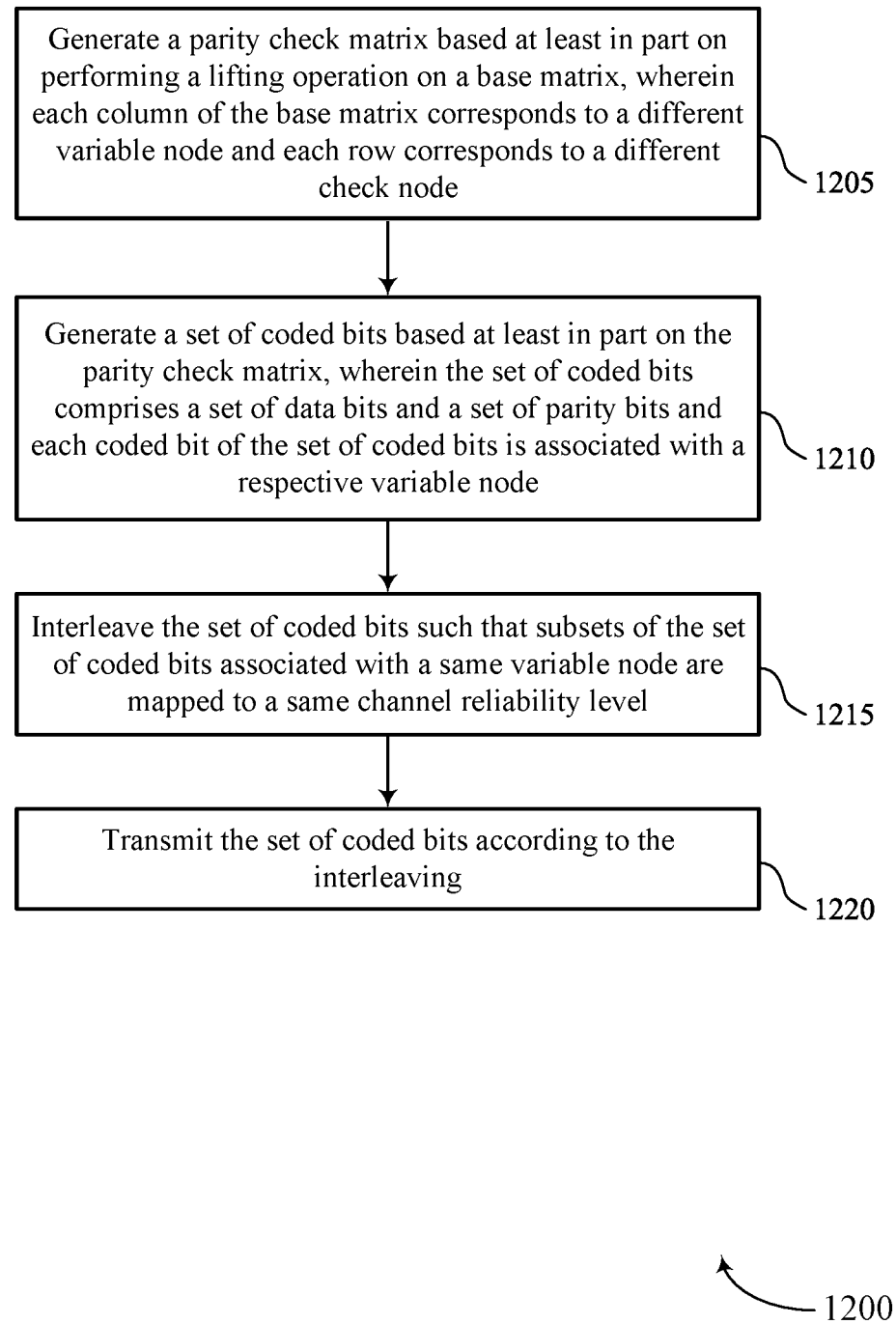
FIGS. 12 through 17 illustrate flowcharts showing methods that support techniques for mapping coded bits to different channel reliability levels for LDPC codes in accordance with one or more aspects of the present disclosure.

FIG. 12 illustrates a flowchart illustrating a method 1200 that supports techniques for mapping coded bits to different channel reliability levels for LDPC codes in accordance with one or more aspects of the present disclosure. The operations of the method 1200 may be implemented by a UE or a network entity or its components as described herein. For example, the operations of the method 1200 may be performed by a UE 115 or a network entity 105 as described with reference to FIGS. 1 through 11. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1205, the method may include generating a parity check matrix based at least on part on performing a lifting operation on a base matrix, wherein each column of the base matrix corresponds to a different variable node and each row corresponds to a different check node. The operations of 1205 may be performed in accordance with examples as disclosed herein. In some examples, aspects of the operations of 1205 may be performed by a parity component 925 as described with reference to FIG. 9.

At 1210, the method may include generating a set of coded bits based at least in part on the parity check matrix, wherein the set of coded bits comprises a set of data bits and a set of parity bits and each coded bit of the set of coded bits is associated with a respective variable node. The operations of 1210 may be performed in accordance with examples as disclosed herein. In some examples, aspects of the operations of 1210 may be performed by an encoding component 930 as described with reference to FIG. 9.

At 1215, the method may include interleaving the set of coded bits such that subsets of the set of coded bits associated with a same variable node are mapped to a same channel reliability level. The operations of 1215 may be performed in accordance with examples as disclosed herein. In some examples, aspects of the operations of 1215 may be performed by an interleaving component 935 as described with reference to FIG. 9.

At 1220, the method may include transmitting the set of coded bits according to the interleaving. The operations of 1220 may be performed in accordance with examples as disclosed herein. In some examples, aspects of the operations of 1220 may be performed by a signal transceiver 940 as described with reference to FIG. 9.

Figure 13:
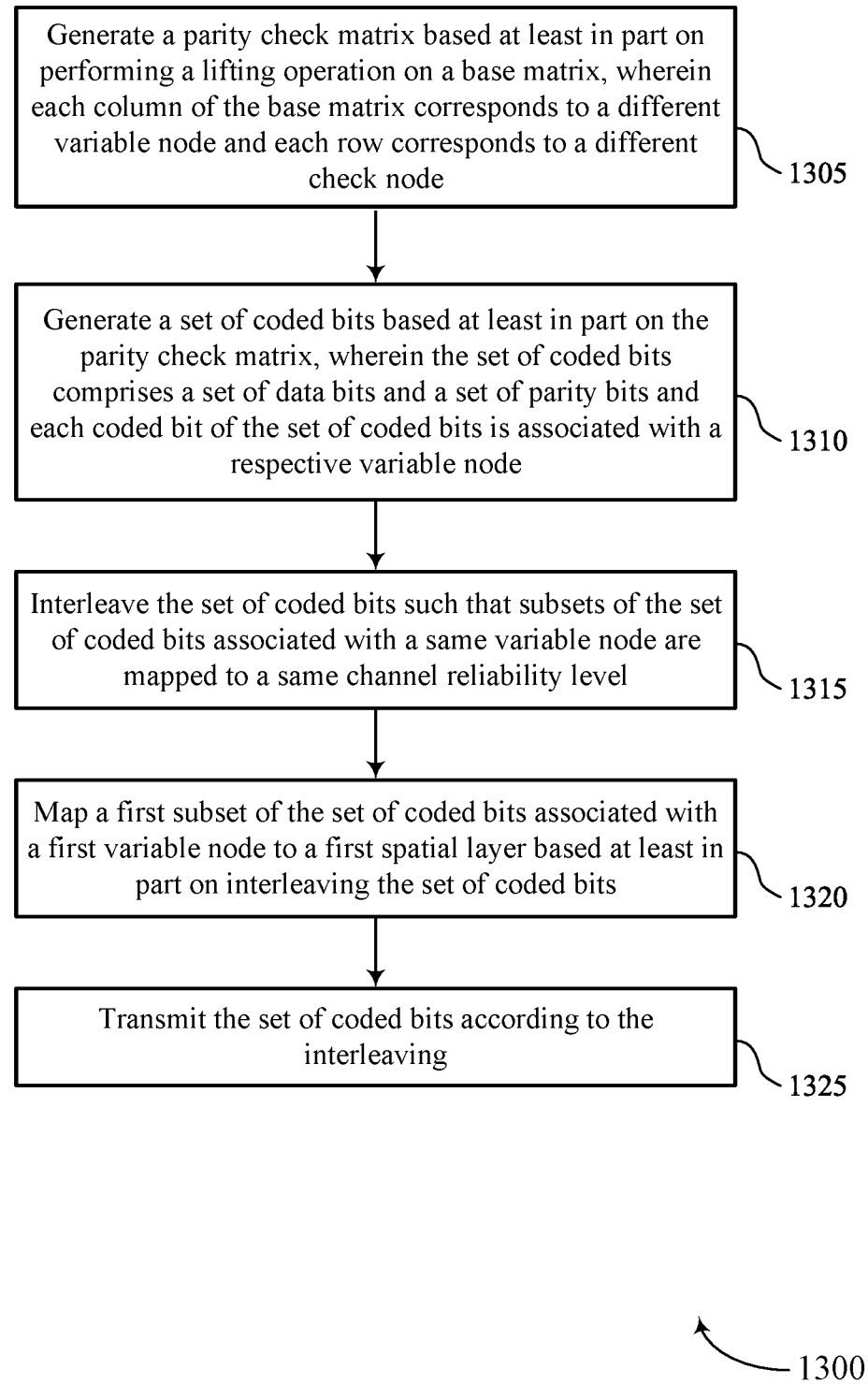

FIG. 13 illustrates a flowchart illustrating a method 1300 that supports techniques for mapping coded bits to different channel reliability levels for LDPC codes in accordance with one or more aspects of the present disclosure. The operations of the method 1300 may be implemented by a UE or a network entity or its components as described herein. For example, the operations of the method 1300 may be performed by a UE 115 or a network entity 105 as described with reference to FIGS. 1 through 11. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1305, the method may include generating a parity check matrix based at least in part on performing a lifting operation on a base matrix, wherein each column of the base matrix corresponds to a different variable node and each row corresponds to a different check node. The operations of 1305 may be performed in accordance with examples as disclosed herein. In some examples, aspects of the operations of 1305 may be performed by a parity component 925 as described with reference to FIG. 9.

At 1310, the method may include generating a set of coded bits based at least in part on the parity check matrix, wherein the set of coded bits comprises a set of data bits and a set of parity bits and each coded bit of the set of coded bits is associated with a respective variable node. The operations of 1310 may be performed in accordance with examples as disclosed herein. In some examples, aspects of the operations of 1310 may be performed by an encoding component 930 as described with reference to FIG. 9.

At 1315, the method may include interleaving the set of coded bits such that subsets of the set of coded bits associated with a same variable node are mapped to a same channel reliability level. The operations of 1315 may be performed in accordance with examples as disclosed herein. In some examples, aspects of the operations of 1315 may be performed by an interleaving component 935 as described with reference to FIG. 9.

At 1320, the method may include mapping a first subset of the set of coded bits associated with a first variable node to a first spatial layer based at least in part on interleaving the set of coded bits. The operations of 1320 may be performed in accordance with examples as disclosed herein. In some examples, aspects of the operations of 1320 may be performed by a mapping component 950 as described with reference to FIG. 9.

At 1325, the method may include transmitting the set of coded bits according to the interleaving. The operations of 1325 may be performed in accordance with examples as disclosed herein. In some examples, aspects of the operations of 1325 may be performed by a signal transceiver 940 as described with reference to FIG. 9.

Figure 14:
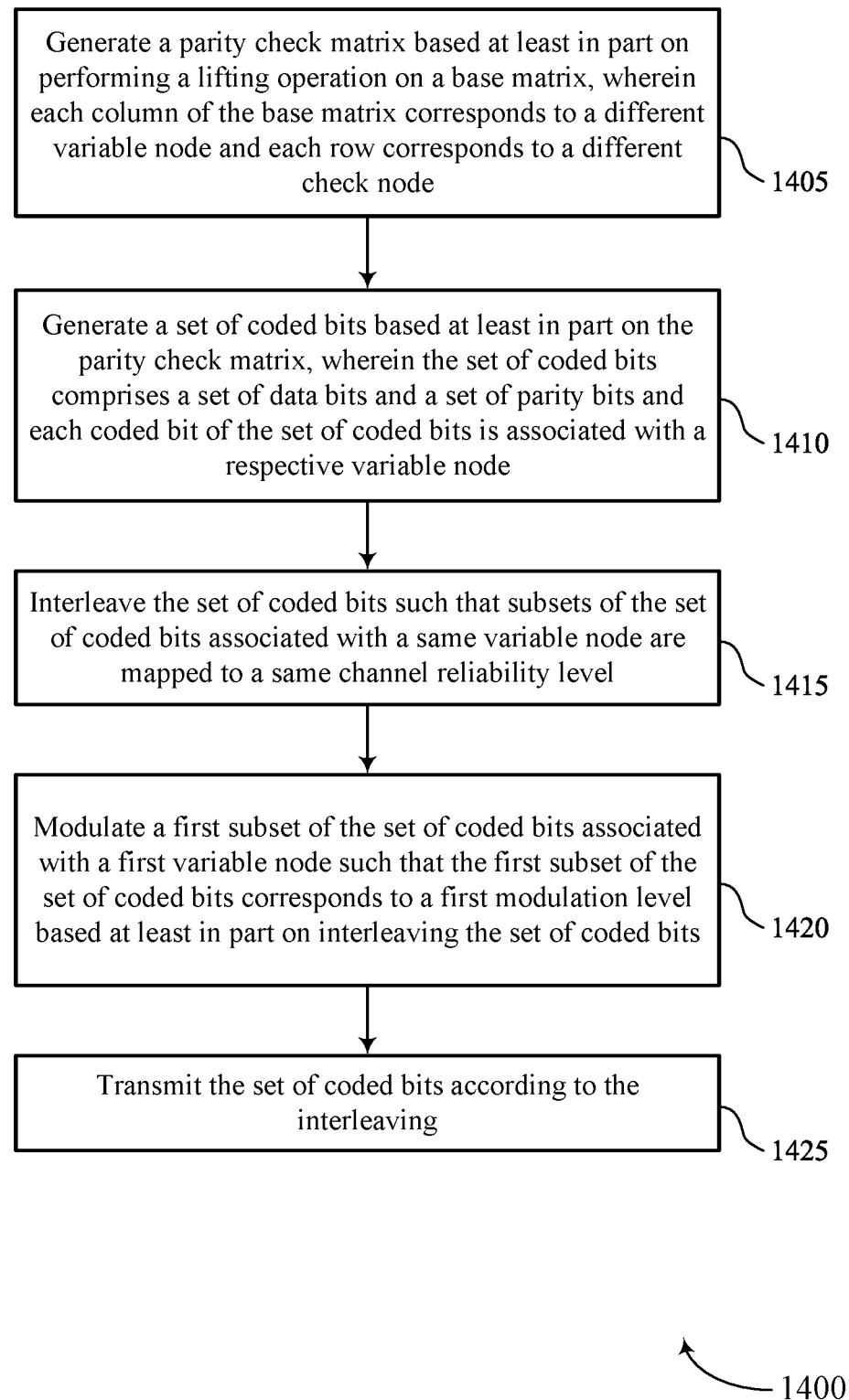

FIG. 14 illustrates a flowchart illustrating a method 1400 that supports techniques for mapping coded bits to different channel reliability levels for LDPC codes in accordance with one or more aspects of the present disclosure. The operations of the method 1400 may be implemented by a UE or a network entity or its components as described herein. For example, the operations of the method 1400 may be performed by a UE 115 or a network entity 105 as described with reference to FIGS. 1 through 11. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1405, the method may include generating a parity check matrix based at least in part on performing a lifting operation on a base matrix, wherein each column of the base matrix corresponds to a different variable node and each row corresponds to a different check node. The operations of 1405 may be performed in accordance with examples as disclosed herein. In some examples, aspects of the operations of 1405 may be performed by a parity component 925 as described with reference to FIG. 9.

At 1410, the method may include generating a set of coded bits based at least in part on the parity check matrix, wherein the set of coded bits comprises a set of data bits and a set of parity bits and each coded bit of the set of coded bits is associated with a respective variable node. The operations of 1410 may be performed in accordance with examples as disclosed herein. In some examples, aspects of the operations of 1410 may be performed by an encoding component 930 as described with reference to FIG. 9.

At 1415, the method may include interleaving the set of coded bits such that subsets of the set of coded bits associated with a same variable node are mapped to a same channel reliability level. The operations of 1415 may be performed in accordance with examples as disclosed herein. In some examples, aspects of the operations of 1415 may be performed by an interleaving component 935 as described with reference to FIG. 9.

At 1420, the method may include modulating a first subset of the set of coded bits associated with a first variable node such that the first subset of the set of coded bits corresponds to a first modulation level based at least in part on interleaving the set of coded bits. The operations of 1420 may be performed in accordance with examples as disclosed herein. In some examples, aspects of the operations of 1420 may be performed by a mapping component 950 as described with reference to FIG. 9.

At 1425, the method may include transmitting the set of coded bits according to the interleaving. The operations of 1425 may be performed in accordance with examples as disclosed herein. In some examples, aspects of the operations of 1425 may be performed by a signal transceiver 940 as described with reference to FIG. 9.

Figure 15:
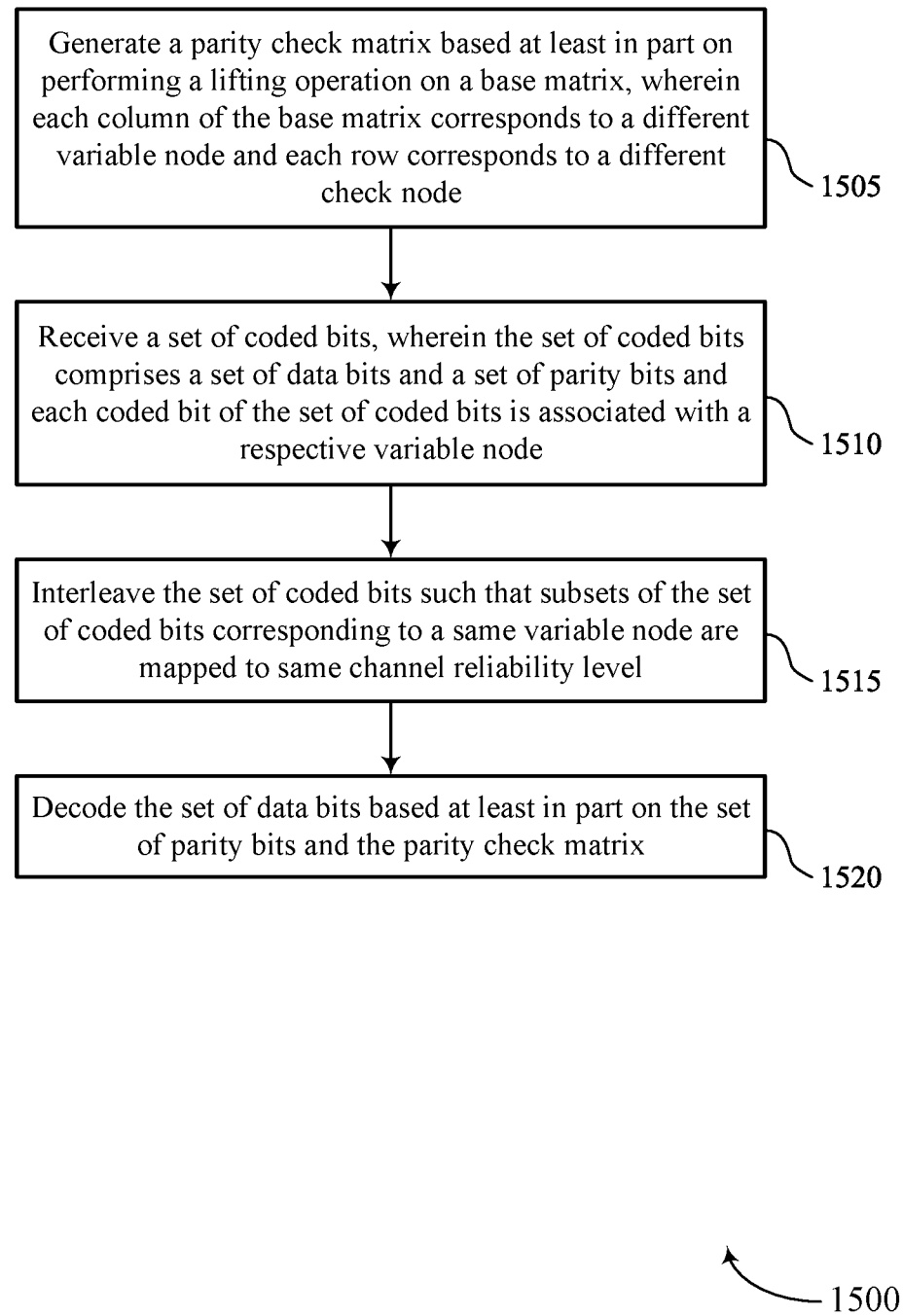

FIG. 15 illustrates a flowchart illustrating a method 1500 that supports techniques for mapping coded bits to different channel reliability levels for LDPC codes in accordance with one or more aspects of the present disclosure. The operations of the method 1500 may be implemented by a UE or a network entity or its components as described herein. For example, the operations of the method 1500 may be performed by a UE 115 or a network entity 105 as described with reference to FIGS. 1 through 11. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1505, the method may include generating a parity check matrix based at least in part on performing a lifting operation on a base matrix, wherein each column of the base matrix corresponds to a different variable node and each row corresponds to a different check node. The operations of 1505 may be performed in accordance with examples as disclosed herein. In some examples, aspects of the operations of 1505 may be performed by a parity component 925 as described with reference to FIG. 9.

At 1510, the method may include receiving a set of coded bits, wherein the set of coded bits comprises a set of data bits and a set of parity bits and each coded bit of the set of coded bits is associated with a respective variable node. The operations of 1510 may be performed in accordance with examples as disclosed herein. In some examples, aspects of the operations of 1510 may be performed by a signal transceiver 940 as described with reference to FIG. 9.

At 1515, the method may include interleaving the set of coded bits such that subsets of the set of coded bits corresponding to a same variable node are mapped to same channel reliability level. The operations of 1515 may be performed in accordance with examples as disclosed herein.

In some examples, aspects of the operations of 1515 may be performed by an interleaving component 935 as described with reference to FIG. 9.

At 1520, the method may include decoding the set of data bits based at least in part on the set of parity bits and the parity check matrix. The operations of 1520 may be performed in accordance with examples as disclosed herein. In some examples, aspects of the operations of 1520 may be performed by a decoding component 945 as described with reference to FIG. 9.

Figure 16:
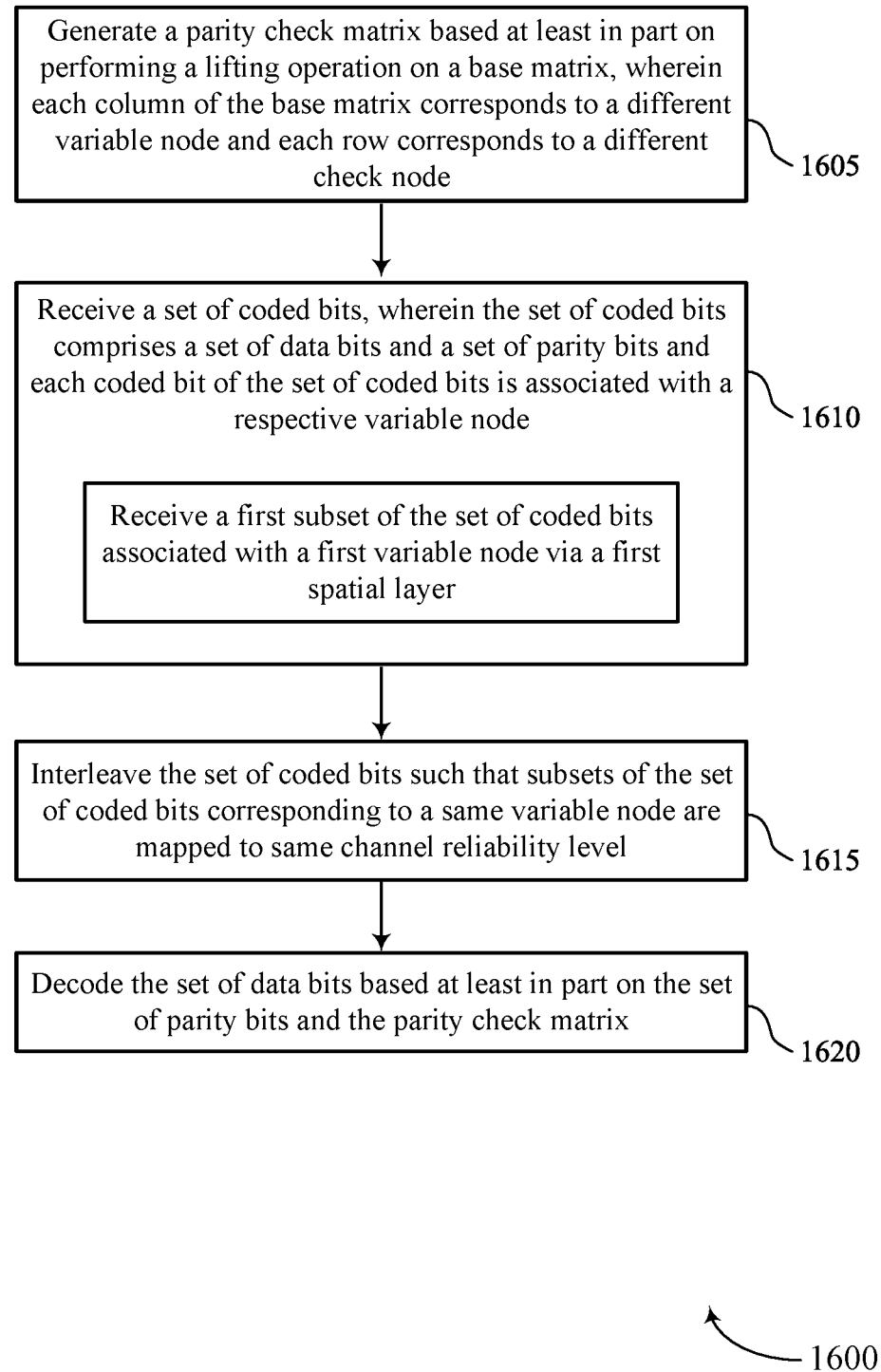

FIG. 16 illustrates a flowchart illustrating a method 1600 that supports techniques for mapping coded bits to different channel reliability levels for LDPC codes in accordance with one or more aspects of the present disclosure. The operations of the method 1600 may be implemented by a UE or a network entity or its components as described herein. For example, the operations of the method 1600 may be performed by a UE 115 or a network entity 105 as described with reference to FIGS. 1 through 11. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1605, the method may include generating a parity check matrix based at least in part on performing a lifting operation on a base matrix, wherein each column of the base matrix corresponds to a different variable node and each row corresponds to a different check node. The operations of 1605 may be performed in accordance with examples as disclosed herein. In some examples, aspects of the operations of 1605 may be performed by a parity component 925 as described with reference to FIG. 9.

At 1610, the method may include receiving a set of coded bits, wherein the set of coded bits comprises a set of data bits and a set of parity bits and each coded bit of the set of coded bits is associated with a respective variable node. The operations of 1610 may be performed in accordance with examples as disclosed herein. In some examples, aspects of the operations of 1610 may be performed by a signal transceiver 940 as described with reference to FIG. 9. The method at 1610 may further include receiving a first subset of the set of coded bits associated with a first variable node via a first spatial layer.

At 1615, the method may include interleaving the set of coded bits such that subsets of the set of coded bits corresponding to a same variable node are mapped to same channel reliability level. The operations of 1615 may be performed in accordance with examples as disclosed herein. In some examples, aspects of the operations of 1615 may be performed by an interleaving component 935 as described with reference to FIG. 9.

At 1620, the method may include decoding the set of data bits based at least in part on the set of parity bits and the parity check matrix. The operations of 1620 may be performed in accordance with examples as disclosed herein. In some examples, aspects of the operations of 1620 may be performed by a decoding component 945 as described with reference to FIG. 9.

Figure 17:
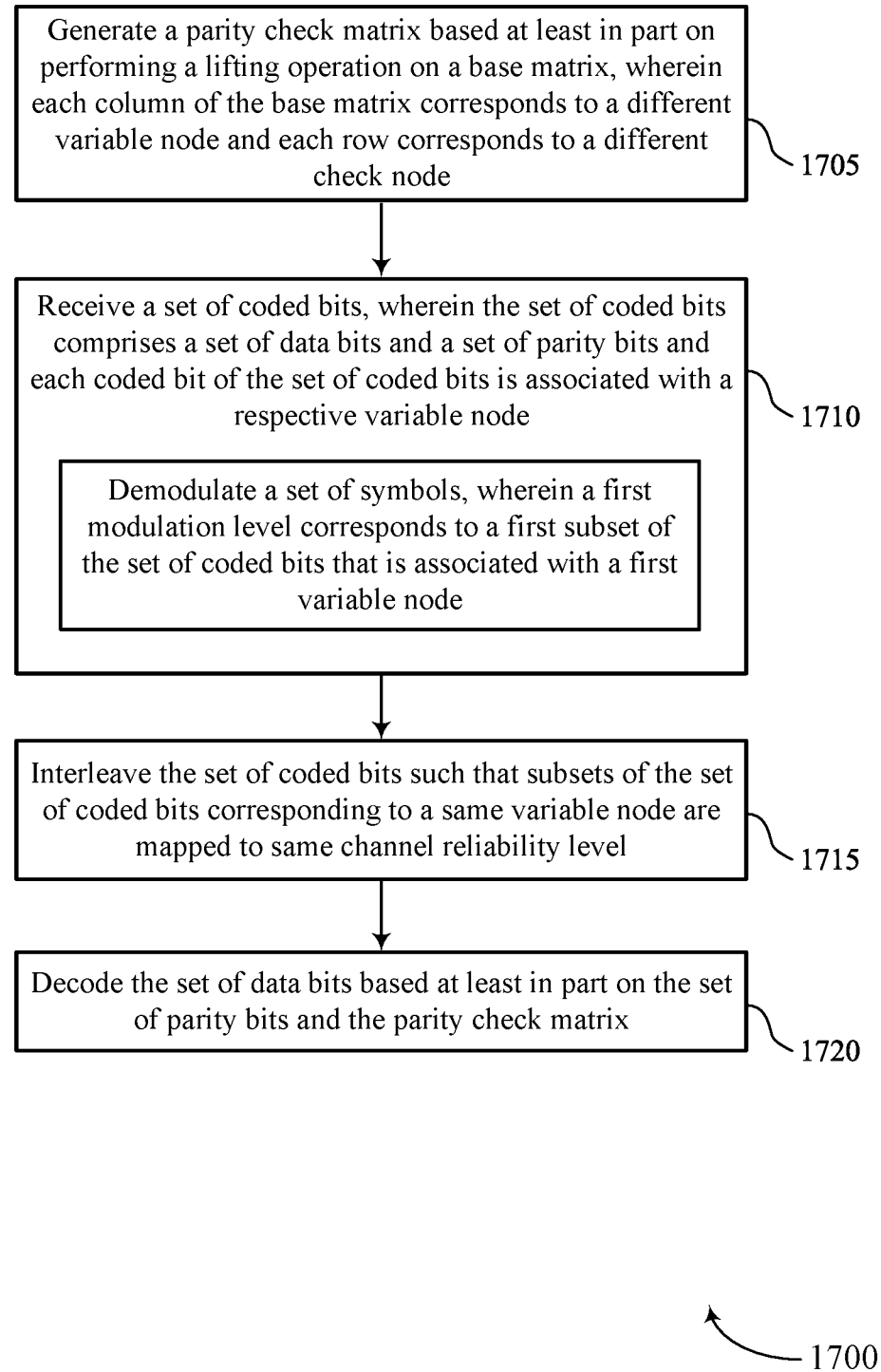

FIG. 17 illustrates a flowchart illustrating a method 1700 that supports techniques for mapping coded bits to different channel reliability levels for LDPC codes in accordance with one or more aspects of the present disclosure. The operations of the method 1700 may be implemented by a UE or a network entity or its components as described herein. For example, the operations of the method 1700 may be performed by a UE 115 or a network entity 105 as described with reference to FIGS. 1 through 11. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1705, the method may include generating a parity check matrix based at least in part on performing a lifting operation on a base matrix, wherein each column of the base matrix corresponds to a different variable node and each row corresponds to a different check node. The operations of 1705 may be performed in accordance with examples as disclosed herein. In some examples, aspects of the operations of 1705 may be performed by a parity component 925 as described with reference to FIG. 9.

At 1710, the method may include receiving a set of coded bits, wherein the set of coded bits comprises a set of data bits and a set of parity bits and each coded bit of the set of coded bits is associated with a respective variable node. The operations of 1710 may be performed in accordance with examples as disclosed herein. In some examples, aspects of the operations of 1710 may be performed by a signal transceiver 940 as described with reference to FIG. 9. The method at 1710 may further include demodulating a set of symbols, where a first modulation level corresponds to a first subset of the set of coded bits that is associated with a first variable node.

At 1715, the method may include interleaving the set of coded bits such that subsets of the set of coded bits corresponding to a same variable node are mapped to same channel reliability level. The operations of 1715 may be performed in accordance with examples as disclosed herein. In some examples, aspects of the operations of 1715 may be performed by an interleaving component 935 as described with reference to FIG. 9.

At 1720, the method may include decoding the set of data bits based at least in part on the set of parity bits and the parity check matrix. The operations of 1720 may be performed in accordance with examples as disclosed herein. In some examples, aspects of the operations of 1720 may be performed by a decoding component 945 as described with reference to FIG. 9.

The following provides an overview of aspects of the present disclosure:

Aspect 1: An method for wireless communication at a wireless device (e.g., a first device, a transmitter device, or a transmitting device), comprising: generating a parity check matrix based at least in part on performing a lifting operation on a base matrix, wherein each column of the base matrix corresponds to a different variable node and each row corresponds to a different check node; generating a set of coded bits based at least in part on the parity check matrix, wherein the set of coded bits comprises a set of data bits and a set of parity bits and each coded bit of the set of coded bits is associated with a respective variable node; interleaving the set of coded bits such that subsets of the set of coded bits associated with a same variable node are mapped to a same channel reliability level; and transmitting the set of coded bits according to the interleaving.

Aspect 2: The method of aspect 1, further comprising: mapping a first subset of the set of coded bits associated with a first variable node to a first spatial layer based at least in part on interleaving the set of coded bits.

Aspect 3: The method of aspect 2, further comprising: mapping a second subset of the set of coded bits associated with a second variable node to a second spatial layer based at least in part on interleaving the set of coded bits.

Aspect 4: The method of any of aspects 2 through 3, further comprising: mapping at least a portion of a second subset of the set of coded bits associated with a second variable node to the first spatial layer based at least in part on interleaving the set of coded bits, wherein the second variable node is adjacent to the first variable node in the base matrix.

Aspect 5: The method of any of aspects 1 through 4, further comprising: modulating a first subset of the set of coded bits associated with a first variable node such that the first subset of the set of coded bits corresponds to a first modulation level based at least in part on interleaving the set of coded bits.

Aspect 6: The method of aspect 5, further comprising: mapping the first subset of the set of coded bits to a first spatial layer based at least in part on interleaving the set of coded bits.

Aspect 7: The method of any of aspects 1 through 6, wherein transmitting the set of coded bits comprises transmitting a first subset of the set of coded bits associated with a first variable node using a same frequency hop, a same PRG, or a same PRB.

Aspect 8: The method of any of aspects 1 through 7, further comprising: generating a set of shaped bits and a set of unshaped bits based at least in part on performing a probabilistic shaping operation, wherein the set of data bits comprises the set of unshaped bits and the set of shaped bits; and interleaving, prior to generate the set of coded bits, the set of data bits such that subsets of the set of shaped bits associated with a same variable node are mapped to a same channel reliability level.

Aspect 9: The method of aspect 8, further comprising: mapping each unshaped bit of the set of unshaped bits to a MSB of a respective symbol.

Aspect 10: The method of any of aspects 1 through 9, wherein an interleaver used to perform the interleaving of the set of coded bits comprises a block-interleaver.

Aspect 11: The method of aspect 10, wherein the block-interleaver has a depth that is equal to a modulation order multiplied with a threshold quantity of spatial layers and a length that is equal to a threshold number of subcarriers.

Aspect 12: A method for wireless communication at a wireless device (e.g., a second device, a receiver device, or a receiving device), comprising: generating a parity check matrix based at least in part on performing a lifting operation on a base matrix, wherein each column of the base matrix corresponds to a different variable node and each row corresponds to a different check node; receiving a set of coded bits, wherein the set of coded bits comprises a set of data bits and a set of parity bits and each coded bit of the set of coded bits is associated with a respective variable node; interleaving the set of coded bits such that subsets of the set of coded bits corresponding to a same variable node are mapped to same channel reliability level; and decoding the set of data bits based at least in part on the set of parity bits and the parity check matrix.

Aspect 13: The method of aspect 12, wherein receiving the set of coded bits comprises: receiving a first subset of the set of coded bits associated with a first variable node via a first spatial layer.

Aspect 14: The method of aspect 13, wherein receiving the set of coded bits comprises: receiving a second subset of the set of coded bits associated with a second variable node via a second spatial layer.

Aspect 15: The method of any of aspects 13 through 14, wherein receiving the set of coded bits comprises: receiving at least a portion of a second subset of the set of coded bits associated with a second variable node via the first spatial layer, wherein the second variable node is adjacent to the first variable node in the base matrix.

Aspect 16: The method of any of aspects 12 through 15, further comprising: demodulating a set of symbols, wherein a first modulation level corresponds to a first subset of the set of coded bits that is associated with a first variable node.

Aspect 17: The method of aspect 16, wherein receiving the set of coded bits comprises: receiving the first subset of the set of coded bits via a first spatial layer.

Aspect 18: The method of any of aspects 12 through 17, wherein receiving the set of coded bits comprises: receiving a first subset of the set of coded bits associated with a first variable node using a same frequency hop, a same PRG, or a same PRB.

Aspect 19: The method of any of aspects 12 through 18, further comprising: interleaving, after determining the set of data bits, a set of shaped bits such that a first subset of the set of shaped bits corresponding to an imaginary part of an amplitude are grouped together and a second subset of the set of shaped bits corresponding to a real part of the amplitude are grouped together, wherein the set of data bits comprises the set of shaped bits and a set of unshaped bits; and performing a probabilistic shaping operation on the set of data bits.

Aspect 20: The method of any of aspects 12 through 19, wherein an interleaver used to perform the interleaving of the set of coded bits comprises a block-interleaver.

Aspect 21: The method of aspect 20, wherein the block-interleaver has a depth that is equal to a modulation order multiplied by a threshold quantity of spatial layers and a length that is equal to a threshold number of subcarriers.

Aspect 22: An apparatus for wireless communication at a wireless device (e.g., a first device, a transmitter device, or a transmitting device), comprising at least one processor and memory coupled with the at least one processor, the memory storing instructions for the at least one processor to cause the transmitting device to perform a method of any of aspects 1 through 11.

Aspect 23: An apparatus for wireless communication at a wireless device (e.g., a first device, a transmitter device, or a transmitting device), comprising at least one means for performing a method of any of aspects 1 through 11.

Aspect 24: A non-transitory computer-readable medium storing code for wireless communication at a wireless device (e.g., a first device, a transmitter device, or a transmitting device), the code comprising instructions executable by at least one processor to perform a method of any of aspects 1 through 11.

Aspect 25: An apparatus for wireless communication at a wireless device (e.g., a second device, a receiver device, or a receiving device), comprising at least one processor and memory coupled with the at least one processor, the memory storing instructions for the at least one processor to cause the wireless device to perform a method of any of aspects 12 through 21.

Aspect 26: An apparatus for wireless communication at a wireless device (e.g., a second device, a receiver device, or a receiving device), comprising at least one means for performing a method of any of aspects 12 through 21.

Aspect 27: A non-transitory computer-readable medium storing code for wireless communication at a wireless device (e.g., a second device, a receiver device, or a receiving device), the code comprising instructions executable by at least one processor to perform a method of any of aspects 12 through 21.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies, including future systems and radio technologies, not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed using a general-purpose processor, a DSP, an ASIC, a CPU, a GPU, an FPGA or other programmable logic device, discrete gate or transistor logic, discrete hardware components, or any combination thereof designed to perform the functions described herein. A general-purpose processor may be a microprocessor but, in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented using hardware, software executed by a processor, or any combination thereof. Software shall be construed broadly to mean instructions, instruction sets, code, code segments, program code, programs, subprograms, software modules, applications, software applications, software packages, routines, subroutines, objects, executables, threads of execution, procedures, or functions, whether referred to as software, firmware, middleware, microcode, hardware description language, or otherwise. If implemented using software executed by a processor, the functions may be stored as or transmitted using one or more instructions or code of a computer-readable medium. Other examples and implementations are within the scope of the disclosure and appended claims. For example, due to the nature of software, functions described herein may be implemented using software executed by a processor, hardware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one location to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, phase change memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc. Disks may reproduce data magnetically, and discs may reproduce data optically using lasers. Combinations of the above are also included within the scope of computer-readable media.

As used herein, including in the claims, "or" as used in a list of items (e.g., including a list of items prefaced by a phrase such as "at least one of" or "one or more of") indicates an inclusive list such that, for example, a list of at least one of A, B, or C means, e.g., A or B or C or AB or AC or BC or ABC (e.g., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on." As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

The term "determine" or "determining" or "identify" or "identifying" encompasses a variety of actions and, therefore, "determining" or "identifying" can include calculating, computing, processing, deriving, investigating, looking up (such as via looking up in a table, a database or another data structure), ascertaining and the like. Also, "determining" or "identifying" can include receiving (such as receiving information or signaling, e.g., receiving information or signaling for determining, receiving information or signaling for identifying), accessing (such as accessing data in a memory, or accessing information) and the like. Also, "determining" or "identifying" can include resolving, obtaining, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus for wireless communication at a wireless device, comprising:
   at least one processor; and
   memory coupled with the at least one processor, the memory storing instructions for the at least one processor to cause the wireless device to:
     generate a parity check matrix based at least in part on performing a lifting operation on a base matrix, wherein each column of the base matrix corresponds to a different variable node and each row corresponds to a different check node;
     generate a set of coded bits based at least in part on the parity check matrix, wherein the set of coded bits comprises a set of data bits and a set of parity bits and each coded bit of the set of coded bits is associated with a respective variable node;
     interleave the set of coded bits such that subsets of the set of coded bits associated with a same variable node are mapped to a same channel reliability level; and
     transmit the set of coded bits according to the interleaving.

2. The apparatus of claim 1, wherein the instructions are further for the at least one processor to cause the wireless device to:
   map a first subset of the set of coded bits associated with a first variable node to a first spatial layer based at least in part on interleaving the set of coded bits.

3. The apparatus of claim 2, wherein the instructions are further for the at least one processor to cause the wireless device to:
   map a second subset of the set of coded bits associated with a second variable node to a second spatial layer based at least in part on interleaving the set of coded bits.

4. The apparatus of claim 2, wherein the instructions are further for the at least one processor to cause the wireless device to:
   map at least a portion of a second subset of the set of coded bits associated with a second variable node to the first spatial layer based at least in part on interleaving the set of coded bits, wherein the second variable node is adjacent to the first variable node in the base matrix.

5. The apparatus of claim 1, wherein the instructions are further for the at least one processor to cause the wireless device to:
   modulate a first subset of the set of coded bits associated with a first variable node such that the first subset of the set of coded bits corresponds to a first modulation level based at least in part on interleaving the set of coded bits.

6. The apparatus of claim 5, wherein the instructions are further for the at least one processor to cause the wireless device to:
   map the first subset of the set of coded bits to a first spatial layer based at least in part on interleaving the set of coded bits.

7. The apparatus of claim 1, wherein the instructions to transmit the set of coded bits are for the at least one processor to cause the wireless device to:
   transmit a first subset of the set of coded bits associated with a first variable node using a same frequency hop, a same precoding resource block group, or a same physical resource block.

8. The apparatus of claim 1, wherein the instructions are further for the at least one processor to cause the wireless device to:
   generate a set of shaped bits and a set of unshaped bits based at least in part on performing a probabilistic shaping operation, wherein the set of data bits comprises the set of unshaped bits and the set of shaped bits; and
   interleave, prior to generate the set of coded bits, the set of data bits such that subsets of the set of shaped bits associated with a same variable node are mapped to a same channel reliability level.

9. The apparatus of claim 8, wherein the instructions are further for the at least one processor to cause the wireless device to:
   map each unshaped bit of the set of unshaped bits to a most significant bit (MSB) of a respective symbol.

10. The apparatus of claim 1, wherein an interleaver used to perform the interleaving of the set of coded bits comprises a block-interleaver.

11. The apparatus of claim 10, wherein the block-interleaver has a depth that is equal to a modulation order multiplied with a threshold quantity of spatial layers and a length that is equal to a threshold number of subcarriers.

12. An apparatus for wireless communication at a wireless device, comprising:
   at least one processor; and
   memory coupled with the at least one processor, the memory storing instructions for the at least one processor to cause the wireless device to:
     generate a parity check matrix based at least in part on performing a lifting operation on a base matrix, wherein each column of the base matrix corresponds to a different variable node and each row corresponds to a different check node;
     receive a set of coded bits, wherein the set of coded bits comprises a set of data bits and a set of parity bits and each coded bit of the set of coded bits is associated with a respective variable node;
     interleave the set of coded bits such that subsets of the set of coded bits corresponding to a same variable node are mapped to same channel reliability level; and decode the set of data bits based at least in part on the set of parity bits and the parity check matrix.

13. The apparatus of claim 12, wherein the instructions to receive the set of coded bits are for the at least one processor to cause the wireless device to:
receive a first subset of the set of coded bits associated with a first variable node via a first spatial layer.

14. The apparatus of claim 13, wherein the instructions to receive the set of coded bits are for the at least one processor to cause the wireless device to:
receive a second subset of the set of coded bits associated with a second variable node via a second spatial layer.

15. The apparatus of claim 13, wherein the instructions to receive the set of coded bits are for the at least one processor to cause the wireless device to:
receive at least a portion of a second subset of the set of coded bits associated with a second variable node via the first spatial layer, wherein the second variable node is adjacent to the first variable node in the base matrix.

16. The apparatus of claim 12, wherein the instructions are further for the at least one processor to cause the wireless device to:
demodulate a set of symbols, wherein a first modulation level corresponds to a first subset of the set of coded bits that is associated with a first variable node.

17. The apparatus of claim 16, wherein the instructions to receive the set of coded bits are for the at least one processor to cause the wireless device to:
receive the first subset of the set of coded bits via a first spatial layer.

18. The apparatus of claim 12, wherein the instructions to receive the set of coded bits are for the at least one processor to cause the wireless device to:
receive a first subset of the set of coded bits associated with a first variable node using a same frequency hop, a same precoding resource block group, or a same physical resource block.

19. The apparatus of claim 12, wherein the instructions are further for the at least one processor to cause the wireless device to:
interleave, after determining the set of data bits, a set of shaped bits such that a first subset of the set of shaped bits corresponding to an imaginary part of an amplitude are grouped together and a second subset of the set of shaped bits corresponding to a real part of the amplitude are grouped together, wherein the set of data bits comprises the set of shaped bits and a set of unshaped bits; and
perform a probabilistic shaping operation on the set of data bits.

20. The apparatus of claim 12, wherein an interleaver used to perform the interleaving of the set of coded bits comprises a block-interleaver.

21. The apparatus of claim 20, wherein the block-interleaver has a depth that is equal to a modulation order multiplied by a threshold quantity of spatial layers and a length that is equal to a threshold number of subcarriers.

22. A method for wireless communication at a wireless device, comprising:
generating a parity check matrix based at least in part on performing a lifting operation on a base matrix, wherein each column of the base matrix corresponds to a different variable node and each row corresponds to a different check node;
generating a set of coded bits based at least in part on the parity check matrix, wherein the set of coded bits comprises a set of data bits and a set of parity bits and each coded bit of the set of coded bits is associated with a respective variable node;
interleaving the set of coded bits such that subsets of the set of coded bits associated with a same variable node are mapped to a same channel reliability level; and
transmitting the set of coded bits according to the interleaving.

23. The method of claim 22, further comprising:
mapping a first subset of the set of coded bits associated with a first variable node to a first spatial layer based at least in part on interleaving the set of coded bits.

24. The method of claim 22, further comprising:
modulating a first subset of the set of coded bits associated with a first variable node such that the first subset of the set of coded bits corresponds to a first modulation level based at least in part on interleaving the set of coded bits.

25. The method of claim 22, wherein transmitting the set of coded bits comprises:
transmitting a first subset of the set of coded bits associated with a first variable node using a same frequency hop, a same precoding resource block group, or a same physical resource block.

26. The method of claim 22, further comprising:
generating a set of shaped bits and a set of unshaped bits based at least in part on performing a probabilistic shaping operation, wherein the set of data bits comprises the set of unshaped bits and the set of shaped bits; and
interleaving, prior to generating the set of coded bits, the set of data bits such that subsets of the set of shaped bits associated with a same variable node are mapped to a same channel reliability level.

27. A method for wireless communication at a wireless device, comprising:
generating a parity check matrix based at least in part on performing a lifting operation on a base matrix, wherein each column of the base matrix corresponds to a different variable node and each row corresponds to a different check node;
receiving a set of coded bits, wherein the set of coded bits comprises a set of data bits and a set of parity bits and each coded bit of the set of coded bits is associated with a respective variable node;
interleaving the set of coded bits such that subsets of the set of coded bits corresponding to a same variable node are mapped to same channel reliability level; and
decoding the set of data bits based at least in part on the set of parity bits and the parity check matrix.

28. The method of claim 27, wherein receiving the set of coded bits comprises:
receiving a first subset of the set of coded bits associated with a first variable node via a first spatial layer.

29. The method of claim 27, further comprising:
demodulating a set of symbols, wherein a first modulation level corresponds to a first subset of the set of coded bits that is associated with a first variable node.

30. The method of claim 27, wherein receiving the set of coded bits comprises:
receiving a first subset of the set of coded bits associated with a first variable node using a same frequency hop, a same precoding resource block group, or a same physical resource block.

* * * * *